US011631828B2

(12) United States Patent
Baby et al.

(10) Patent No.: US 11,631,828 B2
(45) Date of Patent: Apr. 18, 2023

(54) FOLDABLE ELECTRONIC DEVICE MODULES WITH IMPACT AND BEND RESISTANCE

(71) Applicant: CORNING INCORPORATED, Corning, NY (US)

(72) Inventors: Shinu Baby, Painted Post, NY (US); Dhananjay Joshi, Painted Post, NY (US); Yousef Kayed Qaroush, Painted Post, NY (US); Bin Zhang, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 442 days.

(21) Appl. No.: 16/754,581

(22) PCT Filed: Oct. 9, 2018

(86) PCT No.: PCT/US2018/055024
§ 371 (c)(1),
(2) Date: Apr. 8, 2020

(87) PCT Pub. No.: WO2019/074932
PCT Pub. Date: Apr. 18, 2019

(65) Prior Publication Data
US 2020/0287156 A1    Sep. 10, 2020

Related U.S. Application Data

(60) Provisional application No. 62/571,028, filed on Oct. 11, 2017.

(51) Int. Cl.
*H01L 51/52*    (2006.01)
*H01L 27/32*    (2006.01)
(Continued)

(52) U.S. Cl.
CPC ............ *H01L 51/5237* (2013.01); *B32B 7/12* (2013.01); *B32B 27/36* (2013.01);
(Continued)

(58) Field of Classification Search
CPC ............ H01L 51/5237; H01L 27/3244; H01L 51/0097; H01L 51/524; B32B 7/12; B32B 27/36
See application file for complete search history.

(56) References Cited

U.S. PATENT DOCUMENTS 9,321,678 B2    4/2016    Chang et al.
9,431,630 B2    8/2016    Huang et al.
(Continued)

FOREIGN PATENT DOCUMENTS

CN    103474580 A    12/2013
CN    104124383 A    10/2014
(Continued)

OTHER PUBLICATIONS

Korean Patent Application No. 10-2020-7013208 Notice of Non-Final Rejection dated Dec. 25, 2020; 18 Pages; (9 pages of English Translation and 9 pages of Original Document); Korean Patent Office.
(Continued)

*Primary Examiner* — Michael Jung
(74) *Attorney, Agent, or Firm* — Jeffrey A. Schmidt

(57) ABSTRACT

A foldable electronic device module includes: a glass-containing cover element having a thickness from about (25) μm to about (200) μm, an elastic modulus from about (20) to (140) GPa, and first and second primary surfaces; a stack comprising: (a) an interlayer having an elastic modulus from about (0.01) to (10) GPa and a thickness from about 50 to (200) μm, and (b) a flexible substrate having a thickness from about (100) to (200) μm; and a first adhesive joining
(Continued)

the stack to the cover element, and comprising an elastic modulus from about (0.001) to (10) GPa and a thickness from about (5) to (25) μm. Further, the module comprises an impact resistance characterized by tensile stresses of less than about (4100) MPa and less than about (8300) MPa at the first and second primary surfaces of the cover element, respectively, upon an impact in a Pen Drop Test.

24 Claims, 14 Drawing Sheets

(51) Int. Cl.
  *B32B 7/12*     (2006.01)
  *B32B 27/36*    (2006.01)
  *H01L 51/00*    (2006.01)

(52) U.S. Cl.
  CPC ...... *H01L 27/3244* (2013.01); *H01L 51/0097* (2013.01); *H01L 51/524* (2013.01); *B32B 2457/00* (2013.01); *H01L 2251/5338* (2013.01)

(56) References Cited

U.S. PATENT DOCUMENTS

| | | | |
|---|---|---|---|
| 10,622,581 B2 | 4/2020 | Hu et al. | |
| 2014/0050911 A1 | 2/2014 | Mauro et al. | |
| 2014/0072785 A1* | 3/2014 | Kaku | B32B 27/04 |
| | | | 428/213 |
| 2015/0147532 A1 | 5/2015 | Nam et al. | |
| 2017/0062741 A1* | 3/2017 | Shin | H01L 51/5259 |
| 2017/0147117 A1* | 5/2017 | Song | G06F 3/044 |
| 2017/0278899 A1 | 9/2017 | Yang et al. | |
| 2018/0061893 A1* | 3/2018 | Breedlove | G06F 3/0412 |
| 2018/0291238 A1 | 10/2018 | Erdogan-Haug et al. | |
| 2019/0047900 A1 | 2/2019 | Hu et al. | |
| 2022/0050228 A1* | 2/2022 | Yano | B32B 7/12 |
| 2022/0199923 A1* | 6/2022 | Yamane | B32B 27/34 |

FOREIGN PATENT DOCUMENTS

| | | |
|---|---|---|
| JP | 2015-106152 A | 6/2015 |
| KR | 2014007252 A | 1/2014 |
| TW | 201726398 A | 8/2017 |
| WO | 2017/066364 A1 | 4/2017 |
| WO | 2017/123899 A1 | 7/2017 |
| WO | 2017/160680 A1 | 9/2017 |

OTHER PUBLICATIONS

International Search Report and Written Opinion of the International Searching Authority; PCT/US2018/055024; dated Jan. 21, 2019; 12 Pages; European Patent Office.

Kwon et al; "Mechanically and Optically Reliable Folding Structure With a Hyperelastic Material for Seamless Foldable Displays" ; Applied Physics Letters 98, 151904 (2011).

Television Hardware; "Ahead of the Curve: Samsung, LG Debut Flexible Displays"; 7 Pages; (2014); IHS ELECTRONICS360 News Desk; Web-link: http://electronics360.globalspec.com/article/3922/ahead-of-the-curve-samsung-lg-debut-flexible-displays.

Taiwanese Patent Application No. 107135724, Office Action, dated Jul. 16, 2022, 1 page; Taiwanese Patent Office.

Japanese Patent Application No. 2020-520755, Notice of Reasons for Refusal, dated Sep. 15, 2022, 14 pages (7 pages of English Translation and 7 pages of Original Copy); Japanese Patent Office.

\* cited by examiner

FOLDABLE ELECTRONIC DEVICE MODULES WITH IMPACT AND BEND RESISTANCE

CROSS-REFERENCE TO RELATED APPLICATIONS

This application is a national stage entry of International Patent Application Serial No. PCT/US2018/055024, filed on Oct. 9, 2018, which in turn, claims the benefit of priority under 35 U.S.C. § 119 of U.S. Provisional Application Ser. No. 62/571,028 filed on Oct. 11, 2017, the contents of each of which are relied upon and incorporated herein by reference in their entireties.

TECHNICAL FIELD

The disclosure generally relates to foldable electronic device modules and articles. More particularly, the disclosure relates to foldable electronic device modules having a glass-containing cover for foldable display device applications.

BACKGROUND

Flexible versions of products and components that are traditionally rigid in nature are being conceptualized for new applications. For example, flexible electronic devices can provide thin, lightweight and flexible properties that offer opportunities for new applications including curved displays and wearable devices. Many of these flexible electronic devices incorporate flexible substrates for holding and mounting the electronic components of these devices. Metal foils have some advantages including thermal stability and chemical resistance, but suffer from high cost and a lack of optical transparency. Polymeric foils have some advantages including low cost and impact resistance, but suffer from marginal optical transparency, lack of thermal stability, limited hermeticity and cyclic fatigue performance.

Some of these electronic devices also can make use of flexible displays. Optical transparency and thermal stability are often desirable properties for flexible display applications. In addition, flexible displays should have high fatigue and puncture resistance, including resistance to failure at small bend radii, particularly for flexible displays that have touch screen functionality and/or can be folded. Further, flexible displays should be easy to bend and fold by the consumer, depending on the intended application for the display.

Some flexible glass and glass-containing materials offer many of the beneficial properties for flexible and foldable substrate and display applications. However, efforts to harness glass materials for these applications have been difficult. Generally, glass substrates can be manufactured to very low thickness levels (<25 µm) to achieve smaller and smaller bend radii. These "thin" glass substrates suffer from limited puncture resistance. At the same time, thicker glass substrates (>150 µm) can be fabricated with better puncture resistance, but these substrates lack suitable fatigue resistance and mechanical reliability upon bending.

Further, as these flexible glass materials are employed as cover elements in modules that also contain electronic components (e.g., thin film transistors ("TFTs"), touch sensors, etc.), additional layers (e.g., polymeric electronic device panels) and adhesives (e.g., epoxies, optically clear adhesives ("OCAs")), interactions between these various components and elements can lead to increasingly complex stress states that exist during use of the module within an end product, e.g., an electronic display device. These complex stress states can lead to increased stress levels and/or stress concentration factors experienced by the cover elements. As such, these cover elements can be susceptible to cohesive and/or delamination failure modes within the module. Further, these complex interactions can lead to increased bending forces for the consumer to bend and fold the cover element.

Thus, there is a need for flexible, glass-containing materials and module designs that employ these materials for use in various electronic device applications, particularly for flexible electronic display device applications, and more particularly for foldable display device applications.

SUMMARY

According to a first aspect of the disclosure, a foldable electronic device module is provided that includes: a cover element having a thickness from about 25 µm to about 200 µm and a cover element elastic modulus from about 20 GPa to about 140 GPa, the cover element further comprising a component having a glass composition, a first primary surface, and a second primary surface; a stack comprising: (a) an interlayer having first and second primary surfaces, an interlayer elastic modulus from about 0.01 GPa to about 10 GPa and a thickness from about 50 µm to about 200 µm, and (b) a flexible electronic device substrate having a thickness from about 25 µm to about 200 µm; and a first adhesive joining the stack to the second primary surface of the cover element, the first adhesive characterized by an elastic modulus from about 0.001 GPa to about 10 GPa and a thickness from about 5 µm to about 25 µm. Further, the device module comprises an impact resistance characterized by a tensile stress of less than about 4100 MPa at the first primary surface of the cover element and a tensile stress of less than about 8300 MPa at the second primary surface of the cover element upon an impact to the cover element in a Pen Drop Test (as described below). The device module can also comprise an impact resistance characterized by a tensile stress of less than about 3900 MPa at the first primary surface of the cover element and a tensile stress of less than about 7000 MPa at the second primary surface of the cover element upon an impact to the cover element in a Pen Drop Test.

According to a second aspect of the disclosure, a foldable electronic device module is provided that includes: a cover element having a thickness from about 25 µm to about 200 µm and a cover element elastic modulus from about 20 GPa to about 140 GPa, the cover element further comprising a component having a glass composition, a first primary surface, and a second primary surface; a stack comprising: (a) an interlayer having first and second primary surfaces, an interlayer elastic modulus from about 0.01 GPa to about 10 GPa and a thickness from about 50 µm to about 200 µm, and (b) a flexible electronic device substrate having a thickness from about 25 µm to about 200 µm; and a first adhesive joining the stack to the second primary surface of the cover element, the first adhesive characterized by an elastic modulus from about 0.001 GPa to about 10 GPa and a thickness from about 5 µm to about 25 µm. Further, the device module comprises a bending resistance characterized by a bend force of less than about 110 N in the device module upon bending the module in a Two-Point Bend Test such that the first primary surface of the cover element is concave. The device module can also comprise a bending resistance characterized by a bend force of less than about 70 N in the device module upon bending the module in a Two-Point Bend Test such that the first primary surface of the cover element is concave.

According to a third aspect of the disclosure, a foldable electronic device module is provided that includes: a cover element having a thickness from about 25 µm to about 200 µm and a cover element elastic modulus from about 20 GPa to about 140 GPa, the cover element further comprising a component having a glass composition, a first primary surface, and a second primary surface; a stack comprising: (a) an interlayer having first and second primary surfaces, an interlayer elastic modulus from about 0.01 GPa to about 10 GPa and a thickness from about 50 µm to about 200 µm, and (b) a flexible electronic device substrate having a thickness from about 25 µm to about 200 µm; and a first adhesive joining the stack to the second primary surface of the cover element, the first adhesive characterized by an elastic modulus from about 0.001 GPa to about 10 GPa and a thickness from about 5 µm to about 25 µm. Further, the device module comprises a bend stress resistance characterized by a tensile stress of less than about 200 MPa at the second primary surface of the cover element upon bending the module in a Two-Point Bend Test with a plate spacing of about 6 mm such that the first primary surface of the cover element is concave. The device module can also comprise a bend stress resistance characterized by a tensile stress of less than about 150 MPa at the second primary surface of the cover element upon bending the module in a Two-Point Bend Test with a plate spacing of about 6 mm such that the first primary surface of the cover element is concave.

According to a fourth aspect of the disclosure, a foldable electronic device module is provided that includes: a cover element having a thickness from about 25 µm to about 200 µm and a cover element elastic modulus from about 20 GPa to about 140 GPa, the cover element further comprising a component having a glass composition, a first primary surface, and a second primary surface; a stack comprising: (a) an interlayer having first and second primary surfaces, an interlayer elastic modulus from about 0.01 GPa to about 140 GPa and a thickness from about 50 µm to about 200 µm, and (b) a flexible electronic device substrate having a thickness from about 25 µm to about 200 µm; and a first adhesive joining the stack to the second primary surface of the cover element, the first adhesive characterized by an elastic modulus from about 1 GPa to about 10 GPa and a thickness from about 5 µm to about 25 µm. Further, the device module comprises an impact resistance characterized by an average pen drop height of about 6 cm or greater for a set of impacts to the cover element in a Pen Drop Test. The device module can also comprise an impact resistance characterized by an average pen drop height of about 7.2 cm or greater for a set of impacts to the cover element in a Pen Drop Test. In addition, the first adhesive can further comprise a thickness of about 5 µm and a UV-cured photopolymer.

Additional features and advantages will be set forth in the detailed description which follows, and in part will be readily apparent to those skilled in the art from that description or recognized by practicing the embodiments as described herein, including the detailed description which follows, the claims, as well as the appended drawings. For example, the various features of the present specification may be combined according to the following embodiments.

Embodiment 1

A foldable electronic device module, comprising:
a cover element having a thickness from about 25 µm to about 200 µm and a cover element elastic modulus from about 20 GPa to about 140 GPa, the cover element further comprising a component having a glass composition, a first primary surface, and a second primary surface;
a stack comprising:
(a) an interlayer having first and second primary surfaces, an interlayer elastic modulus from about 0.01 GPa to about 10 GPa and a thickness from about 50 µm to about 200 µm, and
(b) a flexible electronic device substrate having a thickness from about 25 µm to about 200 µm that is coupled to the interlayer; and
a first adhesive joining the stack to the second primary surface of the cover element, the first adhesive characterized by an elastic modulus from about 0.001 GPa to about 10 GPa and a thickness from about 5 µm to about 25 µm,
wherein the device module comprises an impact resistance characterized by a tensile stress of less than about 4100 MPa at the first primary surface of the cover element and a tensile stress of less than about 8300 MPa at the second primary surface of the cover element upon an impact to the cover element in a Pen Drop Test.

Embodiment 2

The device module according to Embodiment 1, wherein the device module comprises an impact resistance characterized by a tensile stress of less than about 3900 MPa at the first primary surface of the cover element and a tensile stress of less than about 7000 MPa at the second primary surface of the cover element upon an impact to the cover element in a Pen Drop Test.

Embodiment 3

The device module according to Embodiment 1 or Embodiment 2, wherein the interlayer comprises an elastic modulus from about 5 GPa to about 10 GPa.

Embodiment 4

The device module according to any one of Embodiments 1-3, wherein the device module comprises an impact resistance characterized by a tensile stress of less than about 3700 MPa at the first primary surface of the cover element and a tensile stress of less than about 5500 MPa at the second primary surface of the cover element upon an impact to the cover element in a Pen Drop Test.

Embodiment 5

The device module according to any one of Embodiments 1-4, wherein the interlayer comprises a thickness from about 125 µm to about 200 µm.

Embodiment 6

The device module according to Embodiment 5, wherein the device module comprises an impact resistance characterized by a tensile stress of less than about 3650 MPa at the first primary surface of the cover element and a tensile stress of less than about 6000 MPa at the second primary surface of the cover element upon an impact to the cover element in a Pen Drop Test.

Embodiment 7

The device module according to any one of Embodiments 1-6, wherein the flexible device substrate is a flexible organic light emitting diode (OLED) substrate, wherein the first adhesive comprises one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin, and further wherein the interlayer comprises one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

Embodiment 8

A foldable electronic device module, comprising:
a cover element having a thickness from about 25 μm to about 200 μm and a cover element elastic modulus from about 20 GPa to about 140 GPa, the cover element further comprising a component having a glass composition, a first primary surface, and a second primary surface;
a stack comprising:
(a) an interlayer having first and second primary surfaces, an interlayer elastic modulus from about 0.01 GPa to about 10 GPa and a thickness from about 50 μm to about 200 μm, and
(b) a flexible electronic device substrate having a thickness from about 25 μm to about 200 μm that is coupled to the interlayer; and
a first adhesive joining the stack to the second primary surface of the cover element, the first adhesive characterized by an elastic modulus from about 0.001 GPa to about 10 GPa and a thickness from about 5 μm to about 25 μm,
wherein the device module comprises a bending resistance characterized by a bend force of less than about 110 N in the device module upon bending the module in a Two-Point Bend Test such that the first primary surface of the cover element is concave.

Embodiment 9

The device module according to Embodiment 8, wherein the device module comprises a bending resistance characterized by a bend force of less than 70 N in the device module upon bending the module in a Two-Point Bend Test such that the first primary surface of the cover element is concave.

Embodiment 10

The device module according to Embodiment 8 or Embodiment 9, wherein the interlayer comprises a thickness from about 50 μm to about 125 μm.

Embodiment 11

The device module according to Embodiment 10, wherein the device module comprises a bending resistance characterized by a bend force of less than about 60 N in the device module upon bending the module in a Two-Point Bend Test such that the first primary surface of the cover element is concave.

Embodiment 12

The device module according to any one of Embodiments 8-11, wherein the interlayer comprises an elastic modulus from about 0.01 GPa to about 5 GPa.

Embodiment 13

The device module according to Embodiment 12, wherein the device module comprises a bending resistance characterized by a bend force of less than about 70 N in the device module upon bending the module in a Two-Point Bend Test such that the first primary surface of the cover element is concave.

Embodiment 14

The device module according to any one of Embodiments 8-11, wherein the flexible device substrate is a flexible organic light emitting diode (OLED) substrate, wherein the first adhesive comprises one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin, and further wherein the interlayer comprises one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

Embodiment 15

A foldable electronic device module, comprising:
a cover element having a thickness from about 25 μm to about 200 μm and a cover element elastic modulus from about 20 GPa to about 140 GPa, the cover element further comprising a component having a glass composition, a first primary surface, and a second primary surface;
a stack comprising:
(a) an interlayer having first and second primary surfaces, an interlayer elastic modulus from about 0.01 GPa to about 10 GPa and a thickness from about 50 μm to about 200 μm, and
(b) a flexible electronic device substrate having a thickness from about 25 μm to about 200 μm that is coupled to the interlayer; and
a first adhesive joining the stack to the second primary surface of the cover element, the first adhesive characterized by an elastic modulus from about 0.001 GPa to about 10 GPa and a thickness from about 5 μm to about 25 μm,
wherein the device module comprises a bend stress resistance characterized by a tensile stress of less than about 200 MPa at the second primary surface of the cover element upon bending the module in a Two-Point Bend Test with a plate spacing of about 6 mm such that the first primary surface of the cover element is concave.

Embodiment 16

The device module according to Embodiment 15, wherein the device module comprises a bend stress resistance characterized by a tensile stress of less than about 150 MPa at the second primary surface of the cover element upon bending the module in a Two-Point Bend Test with a plate spacing of about 6 mm such that the first primary surface of the cover element is concave.

Embodiment 17

The device module according to Embodiment 15 or Embodiment 16, wherein the interlayer comprises an elastic modulus from about 0.01 GPa to about 5 GPa.

Embodiment 18

The device module according to Embodiment 17, wherein the device module comprises a bend stress resistance characterized by a tensile stress of less than about 140 MPa at the second primary surface of the cover element upon bending the module in a Two-Point Bend Test with a plate spacing of about 6 mm such that the first primary surface of the cover element is concave.

Embodiment 19

The device module according to any one of Embodiments 15-18, wherein the interlayer comprises a thickness from about 50 µm to about 125 µm.

Embodiment 20

The device module according to Embodiment 19, wherein the device module comprises a bend stress resistance characterized by a tensile stress of less than about 80 MPa at the second primary surface of the cover element upon bending the module in a Two-Point Bend Test with a plate spacing of about 6 mm such that the first primary surface of the cover element is concave.

Embodiment 21

The device module according to any one of Embodiments 15-20, wherein the flexible device substrate is a flexible organic light emitting diode (OLED) substrate,
wherein the first adhesive comprises one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin, and
further wherein the interlayer comprises one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

Embodiment 22

A foldable electronic device module, comprising:
a cover element having a thickness from about 25 µm to about 200 µm and a cover element elastic modulus from about 20 GPa to about 140 GPa, the cover element further comprising a component having a glass composition, a first primary surface, and a second primary surface;
a stack comprising:
(a) an interlayer having first and second primary surfaces, an interlayer elastic modulus from about 0.01 GPa to about 140 GPa and a thickness from about 50 µm to about 200 µm, and
(b) a flexible electronic device substrate having a thickness from about 25 µm to about 200 µm that is coupled to the interlayer; and
a first adhesive joining the stack to the second primary surface of the cover element, the first adhesive characterized by an elastic modulus from about 1 GPa to about 10 GPa and a thickness from about 5 µm to about 25 µm,
wherein the device module comprises an impact resistance characterized by an average pen drop height of about 6 cm or greater for a set of impacts to the cover element in a Pen Drop Test.

Embodiment 23

The device module according to Embodiment 22, wherein the device module comprises an impact resistance characterized by an average pen drop height of about 7.2 cm or greater for a set of impacts to the cover element in a Pen Drop Test.

Embodiment 24

The device module according to Embodiment 22 or Embodiment 23, wherein the first adhesive has a thickness of about 5 µm and comprises a UV-cured photopolymer.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments. Directional terms as used herein—for example, up, down, right, left, front, back, top, bottom—are made only with reference to the figures as drawn and are not intended to imply absolute orientation.

DETAILED DESCRIPTION

Figure 1:
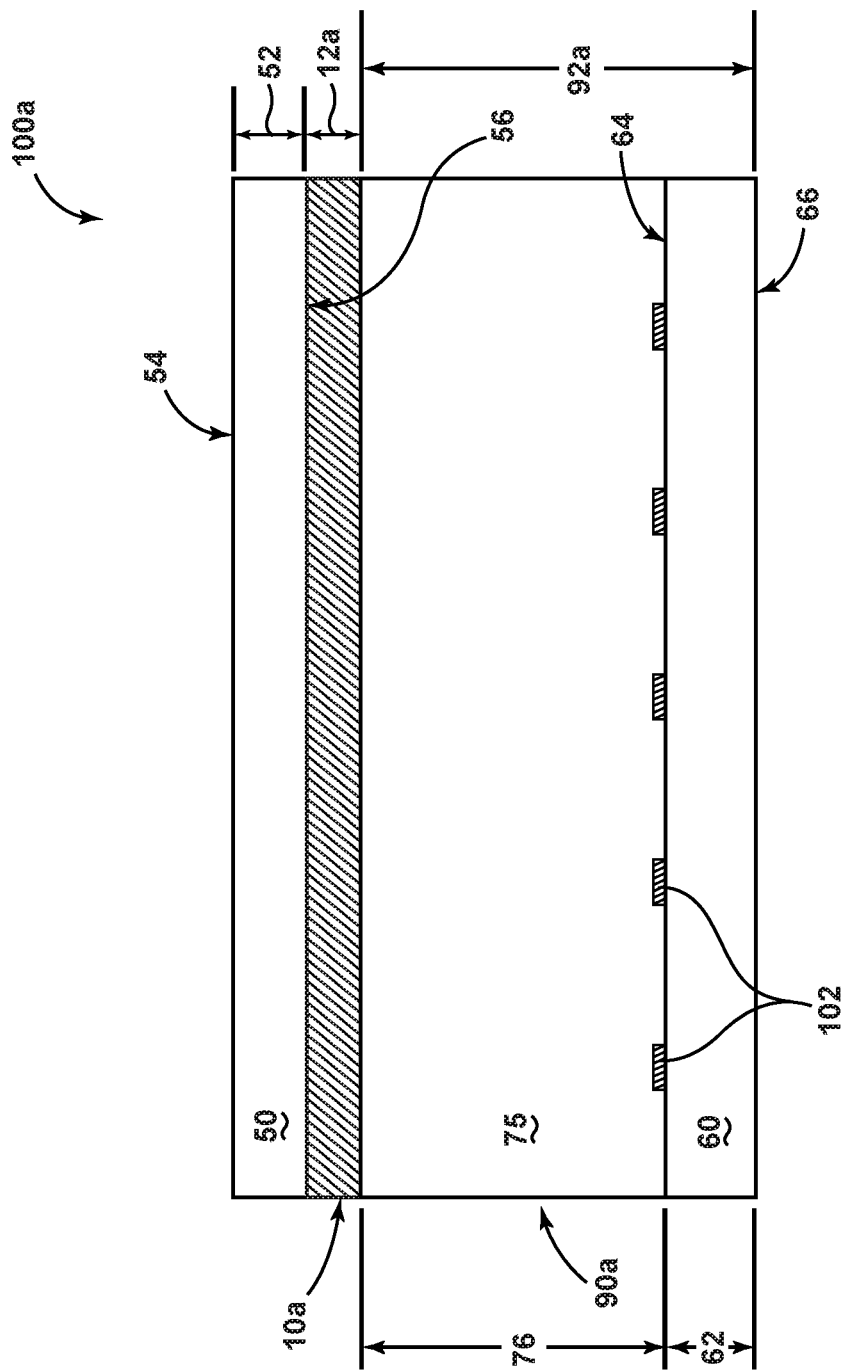
FIG. 1 is a cross-sectional view of a foldable electronic device module according to some aspects of the disclosure.

Reference will now be made in detail to embodiments according to the claims, examples of which are illustrated in the accompanying drawings. Whenever possible, the same reference numerals will be used throughout the drawings to refer to the same or like parts. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Among other features and benefits, the foldable electronic device modules and articles of the disclosure offer impact resistance, limited bending resistance (i.e., ease for the consumer to bend the device) and bend stress resistance, all of which can contribute to mechanical reliability at small bend radii (e.g., in static tension and fatigue) and puncture resistance. With regard to mechanical reliability, the foldable modules of the disclosure are configured to avoid failures in their glass-containing cover elements. The small bend radii and puncture resistance capabilities are beneficial when the bendable modules are used in a foldable electronic device display, for example, one wherein one part of the display is folded over on top of another portion of the display. For example, the foldable device module may be used as one or more of: a cover on the user-facing portion of a foldable electronic display device, a location in which puncture resistance is particularly desirable; a substrate module, disposed internally within the device itself, on which electronic components are disposed; or elsewhere in a foldable electronic display device. Alternatively, the foldable modules of the disclosure may be used in a device not having a display, but one in which a glass or glass-containing layer is used for its beneficial properties and is folded or otherwise bent, in a similar manner as in a foldable display, to a tight bend radius. The puncture resistance is particularly beneficial when the foldable module is used on the exterior of the device, at a location in which a user will interact with it. Still further, the relatively low bending forces to fold or otherwise bend certain configurations of these device modules and articles is particularly beneficial to the user when these modules and articles are employed in applications that include manual bending (e.g., a foldable, wallet-like flexible display device).

More specifically, the foldable electronic device modules in the disclosure can obtain some or all of the foregoing advantages through control of the material properties and thicknesses the cover element, adhesives and interlayers employed within the modules. For example, these foldable modules can exhibit enhanced impact resistance, as characterized by reduced tensile stresses at the primary surfaces of the cover element and/or increases in average pen drop height that are measured in a Pen Drop Test, through increased thickness of the interlayer, increased elastic modulus of the interlayer and/or increased elastic modulus of the first adhesive. These foldable modules can also exhibit enhanced bending resistance, as characterized by reduced bend forces that are measured in a Two-Point Bend Test, through reductions in the thicknesses and/or elastic modulus of the interlayer. In addition, these foldable modules can exhibit enhanced bend stress resistance, as characterized by reduced tensile stresses at the second primary surface of the cover element that are measured in a Two-Point Bend Test, through increases in the thickness and/or elastic modulus of the interlayer. These lower tensile stresses, bending resistance and increased pen drop height performance can lead to improved module reliability, particularly in terms of failure resistance of the cover element as the module is subjected to application-driven bending and/or impact evolutions. Moreover, the embodiments and concepts in the disclosure provide a framework for those with ordinary skill to design foldable electronic device modules to reduce tensile stresses at the primary surfaces of the cover element, reduce bend forces upon bending the module and increase the average pen drop height before failure, all of which can contribute to the reliability, manufacturability and suitability of these modules for use in various applications having differing degrees and quantities of bending and folding evolutions.

Referring to FIG. 1, a foldable electronic device module 100a is depicted according to some aspects of the disclosure that includes a cover element 50, first adhesive 10a, stack 90a, interlayer 75, electronic devices 102 and flexible electronic device substrate 60. Cover element 50 has a thickness 52, a first primary surface 54 and a second primary surface 56. Thickness 52 can range from about 25 µm to about 200 µm, for example from about 25 µm to about 175 µm, from about 25 µm to about 150 µm, from about 25 µm to about 125 µm, from about 25 µm to about 100 µm, from about 25 µm to about 75 µm, from about 25 µm to about 50 µm, from about 50 µm to about 175 µm, from about 50 µm to about 150 µm, from about 50 µm to about 125 µm, from about 50 µm to about 100 µm, from about 50 µm to about 75 µm, from about 75 µm to about 175 µm, from about 75 µm to about 150 µm, from about 75 µm to about 125 µm, from about 75 µm to about 100 µm, from about 100 µm to about 175 µm, from about 100 µm to about 150 µm, from about 100 µm to about 125 µm, from about 125 µm to about 175 µm, from about 125 µm to about 150 µm, and from about 150 µm to about 175 µm. In other aspects, thickness 52 can range from about 25 µm to 150 µm, from about 50 µm to 100 µm, or from about 60 µm to 80 µm. The thickness 52 of the cover element 50 can also be set at other thicknesses between the foregoing ranges and values.

The foldable electronic device module 100a depicted in FIG. 1 includes a cover element 50 with a cover element elastic modulus from about 20 GPa to 140 GPa, for example from about 20 GPa to about 120 GPa, from about 20 GPa to about 100 GPa, from about 20 GPa to about 80 GPa, from about 20 GPa to about 60 GPa, from about 20 GPa to about 40 GPa, from about 40 GPa to about 120 GPa, from about 40 GPa to about 100 GPa, from about 40 GPa to about 80 GPa, from about 40 GPa to about 60 GPa, from about 60 GPa to about 120 GPa, from about 60 GPa to about 100 GPa, from about 60 GPa to about 80 GPa, from about 80 GPa to about 120 GPa, from about 80 GPa to about 100 GPa, and from about 100 GPa to about 120 GPa. The cover element 50 may be a component having a glass composition or include at least one component having a glass composition. In the latter case, the cover element 50 can include one or more layers that include glass-containing materials, e.g., element 50 can be a polymer/glass composite configured with second phase glass particles in a polymeric matrix. In some aspects, the cover element 50 is a glass element characterized by an elastic modulus from about 50 GPa to about 100 GPa, or any elastic modulus value between these limits. In other aspects, the cover element elastic modulus is about 20 GPa, 30 GPa, 40 GPa, 50 GPa, 60 GPa, 70 GPa, 80 GPa, 90 GPa, 100 GPa, 110 GPa, 120 GPa, 130 GPa, 140 GPa, or any elastic modulus value between these values.

In certain aspects of the foldable module 100a depicted in FIG. 1, the cover element 50 can include a glass layer. In other aspects, the cover element 50 can include two or more glass layers. As such, the thickness 52 reflects the sum of the thicknesses of the individual glass layers making up the cover element 50. In those aspects in which the cover element 50 includes two or more individual glass layers, the thickness of each of the individual glass layers is 1 µm or more. For example, the cover element 50 employed in the module 100a can include three glass layers, each having a thickness of about 8 µm, such that the thickness 52 of the cover element 50 is about 24 µm. It should also be understood, however, that the cover element 50 could include other non-glass layers (e.g., compliant polymer layers) sandwiched between multiple glass layers. In other implementations of the module 100a, the cover element 50 can include one or more layers that include glass-containing materials, e.g., element 50 can be a polymer/glass composite configured with second phase glass particles in a polymeric matrix.

In FIG. 1, a foldable electronic device module 100a including a cover element 50 comprising a glass material can be fabricated from alkali-free aluminosilicate, borosilicate, boroaluminosilicate, and silicate glass compositions. The cover element 50 can also be fabricated from alkali-containing aluminosilicate, borosilicate, boroaluminosilicate, and silicate glass compositions. In certain aspects, alkaline earth modifiers can be added to any of the foregoing compositions for the cover element 50. In some aspects, glass compositions according to the following are suitable for a cover element 50 having one or more glass layers: $SiO_2$ at 50 to 75% (by mol %); $Al_2O_3$ at 5 to 20%; $B_2O_3$ at 8 to 23%; MgO at 0.5 to 9%; CaO at 1 to 9%; SrO at 0 to 5%; BaO at 0 to 5%; $SnO_2$ at 0.1 to 0.4%; $ZrO_2$ at 0 to 0.1%; and $Na_2O$ at 0 to 10%, $K_2O$ at 0 to 5%, and $Li_2O$ at 0 to 10%. In some aspects, glass compositions according to the following are suitable for a cover element 50 having one or more glass layers: $SiO_2$ at 64 to 69% (by mol %); $Al_2O_3$ at 5 to 12%; $B_2O_3$ at 8 to 23%; MgO at 0.5 to 2.5%; CaO at 1 to 9%; SrO at 0 to 5%; BaO at 0 to 5%; $SnO_2$ at 0.1 to 0.4%; $ZrO_2$ at 0 to 0.1%; and $Na_2O$ at 0 to 1%. In other aspects, the following composition is suitable for the cover element 50: $SiO_2$ at ~67.4% (by mol %); $Al_2O_3$ at ~12.7%; $B_2O_3$ at ~3.7%; MgO at ~2.4%; CaO at 0%; SrO at 0%; $SnO_2$ at ~0.1%; and $Na_2O$ at ~13.7%. In further aspects, the following composition is also suitable for a glass layer employed in the cover element 50: $SiO_2$ at 68.9% (by mol %); $Al_2O_3$ at 10.3%; $Na_2O$ at 15.2%; MgO at 5.4%; and $SnO_2$ at 0.2%. In other aspects, the cover element 50 can employ the following glass composition ("Glass 1"): $SiO_2$ at ~64% (by mol %); $Al_2O_3$ at ~16%; $Na_2O$ at ~11 mol %; $Li_2O$ at ~6 mol %; ZnO at ~1 mol %; and $P_2O_5$ at ~2%. In further aspects, the following composition is also suitable for a glass layer employed in the cover element 50: $SiO_2$ at 68.9% (by mol %); $Al_2O_3$ at 10.3%; $Na_2O$ at 15.2%; MgO at 5.4%; and $SnO_2$ at 0.2%. Various criteria can be used to select the composition for a cover element 50 comprising a glass material, including but not limited to ease of manufacturing to low thickness levels while minimizing the incorporation of flaws; ease of development of a compressive stress region to offset tensile stresses generated during bending, optical transparency; and corrosion resistance.

The cover element 50 employed in the foldable module 100a can adopt a variety of physical forms and shapes. From a cross-sectional perspective, the element 50, as a single layer or multiple layers, can be flat or planar. In some aspects, the element 50 can be fabricated in non-rectilinear, sheet-like forms depending on the final application. As an example, a mobile display device having an elliptical display and bezel could employ a cover element 50 having a generally elliptical, sheet-like form.

Again referring to FIG. 1, the foldable electronic device module 100a further includes: a stack 90a having a thickness 92a from about 100 µm to 600 µm; and a first adhesive 10a configured to join the stack 90a to the second primary surface 56 of the cover element 50, the first adhesive 10a characterized by a thickness 12a and an elastic modulus from about 0.001 GPa to about 10 GPa, for example, from about 0.001 GPa to about 8 GPa, from about 0.001 GPa to about 6 GPa, from about 0.001 GPa to about 4 GPa, from about 0.001 GPa to about 2 GPa, from about 0.001 GPa to about 1 GPa, from about 0.01 GPa to about 8 GPa, from about 0.01 GPa to about 6 GPa, from about 0.01 GPa to about 4 GPa, from about 0.01 GPa to about 2 GPa, from about 0.1 GPa to about 8 GPa, from about 0.1 GPa to about 6 GPa, from about 0.1 GPa to about 4 GPa, from about 0.2 GPa to about 8 GPa, from about 0.2 GPa to about 6 GPa, and from about 0.5 GPa to about 8 GPa. According to some implementations of the first aspect of the foldable module 100a, the first adhesive 10a is characterized by an elastic modulus of about 0.001 GPa, 0.002 GPa, 0.003 GPa, 0.004 GPa, 0.005 GPa, 0.006 GPa, 0.007 GPa, 0.008 GPa, 0.009 GPa, 0.01 GPa, 0.02 GPa, 0.03 GPa, 0.04 GPa, 0.05 GPa, 0.1 GPa, 0.2 GPa, 0.3 GPa, 0.4 GPa, 0.5 GPa, 0.6 GPa, 0.7 GPa, 0.8 GPa, 0.9 GPa, 1 GPa, 2 GPa, 3 GPa, 4 GPa, 5 GPa, 6 GPa, 7 GPa, 8 GPa, 9 GPa, 10 GPa, or any value or range between these elastic modulus values. Aspects of the foldable modules 100a incorporate an adhesive 10a with a relatively higher elastic modulus, e.g., from about 1 GPa to about 10 GPa, compared to the elastic modulus of conventional adhesives employed in such electronic device applications. The use of such adhesives 10a with relatively higher elastic modulus values unexpectedly provides an enhanced degree of resistance to impacts, as manifested in an increased average pen drop height measured in a Pen Drop Test.

Referring again to the foldable module 100a depicted in FIG. 1, the first adhesive 10a is characterized by a thickness 12a from about 5 µm to about 60 µm, for example, from about 5 µm to about 50 µm, from about 5 µm to about 40 µm, from about 5 µm to about 30 µm, from about 5 µm to about 20 µm, from about 5 µm to about 15 µm, from about 5 µm to about 10 µm, from about 10 µm to about 60 µm, from about 15 µm to about 60 µm, from about 20 µm to about 60 µm, from about 30 µm to about 60 µm, from about 40 µm to about 60 µm, from about 50 µm to about 60 µm, from about 55 µm to about 60 µm, from about 10 jam to about 50 jam, from about 10 µm to about 40 µm, from about 10 µm to about 30 µm, from about 10 µm to about 20 µm, from about 10 µm to about 15 µm, from about 20 µm to about 50 µm, from about 30 µm to about 50 µm, from about 40 µm to about 50 µm, from about 20 µm to about 40 µm, and from about 20 µm to about 30 µm. Other embodiments have a first adhesive 10a characterized by a thickness 12a of about 5 µm, 10 µm, 15 µm, 20 µm, 25 µm, 30 µm, 35 µm, 40 µm, 45 µm, 50 µm, 55 µm, 60 µm, or any thickness ranges or values between these thickness values. In some aspects, the thickness 12a of the first adhesive 10a is from about 5 µm to 25 µm. Some aspects of the foldable modules 100a incorporate an adhesive 10a with a relatively lower thickness, e.g., from about 5 µm to about 10 µm, compared to the thicknesses of conventional adhesives employed in such electronic device applications. The use of such adhesives 10a with relatively lower thickness values unexpectedly provides an enhanced degree of resistance to impacts, as manifested in an increased average pen drop height measured in a Pen Drop Test.

In some embodiments of the foldable module 100a depicted in FIG. 1, the first adhesive 10a is further characterized by a Poisson's ratio from about 0.1 to about 0.5, for example, from about 0.1 to about 0.45, from about 0.1 to about 0.4, from about 0.1 to about 0.35, from about 0.1 to about 0.3, from about 0.1 to about 0.25, from about 0.1 to about 0.2, from about 0.1 to about 0.15, from about 0.2 to about 0.45, from about 0.2 to about 0.4, from about 0.2 to about 0.35, from about 0.2 to about 0.3, from about 0.2 to about 0.25, from about 0.25 to about 0.45, from about 0.25 to about 0.4, from about 0.25 to about 0.35, from about 0.25 to about 0.3, from about 0.3 to about 0.45, from about 0.3 to about 0.4, from about 0.3 to about 0.35, from about 0.35 to about 0.45, from about 0.35 to about 0.4, and from about 0.4 to about 0.45. Other embodiments include a first adhesive 10a characterized by a Poisson's ratio of about 0.1, 0.15, 0.2, 0.25, 0.3, 0.35, 0.4, 0.45, 0.5, or any Poisson's ratio or range of values between these values. In some aspects, the Poisson's ratio of the first adhesive 10a is from about 0.1 to about 0.25.

As outlined above, the foldable electronic device module 100a depicted in FIG. 1 includes an adhesive 10a with certain material properties (e.g., an elastic modulus from about 0.001 GPa to 10 GPa). Example adhesives that can be employed as the adhesive 10a in the module 100a include optically clear adhesives ("OCAs") (e.g., Henkel Corporation LOCTITE® liquid OCAs), epoxies, and other joining materials as understood by those with ordinary skill in the field that are suitable to join the stack 90a (e.g., the interlayer 75 and flexible electronic device substrate 60) to the second primary surface 56 of the cover element 50. Other example adhesives that can be employed as adhesive 10a in the module 100a include one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin.

Referring again to FIG. 1, the stack 90a of the foldable module 100a further includes a flexible electronic device substrate 60 (e.g., an OLED-containing substrate) having first and second primary surfaces 64, 66, a thickness 62, and a device substrate elastic modulus from about 300 MPa to about 10 GPa, for example, from about 300 MPa to 8000 MPa, from about 300 MPa to 6000 MPa, from about 300 MPa to 4000 MPa, from about 300 MPa to 2000 MPa, from about 300 MPa to 1000 MPa, from about 300 MPa to 500 MPa, from about 500 MPa to 8000 MPa, from about 500 MPa to 6000 MPa, from about 500 MPa to 4000 MPa, from about 500 MPa to 2000 MPa, from about 500 MPa to 1000 MPa, from about 1000 MPa to 8000 MPa, from about 1000 MPa to 6000 MPa, from about 1000 MPa to 4000 MPa, from about 1000 MPa to 2000 MPa, from about 2000 MPa to 8000 MPa, from about 2000 MPa to 6000 MPa, from about 2000 MPa to 4000 MPa, from about 4000 MPa to 8000 MPa, from about 4000 MPa to 6000 MPa, and from about 6000 MPa to 8000 MPa, or any elastic modulus values or range of values between the foregoing. Further, in embodiments of the foldable module 100a, the substrate 60 has a thickness 62 from about 25 µm to about 200 µm, for example, from about 25 µm to about 190 µm, from about 25 µm to about 180 µm, from about 25 µm to about 170 µm, from about 25 µm to about 160 µm, from about 25 µm to about 150 µm, from about 25 µm to about 140 µm, from about 25 µm to about 130 µm, from about 25 µm to about 120 µm, from about 25 µm to about 110 µm, from about 25 µm to about 105 µm, from about 25 µm to about 95 µm, from about 25 µm to about 85 µm, from about 25 µm to about 75 µm, from about 25 µm to about 65 µm, from about 25 µm to about 55 µm, from about 25 µm to about 45 µm, about 100 µm to about 200 µm, for example, from about 100 µm to about 190 µm, from about 100 µm to about 180 µm, from about 100 µm to about 170 µm, from about 100 µm to about 160 µm, from about 100 µm to about 150 µm, from about 100 µm to about 140 µm, from about 100 µm to about 130 µm, from about 100 µm to about 120 µm, from about 100 µm to about 110 µm, from about 100 µm to about 105 µm, or any thickness or range of thicknesses between these thickness values.

Suitable materials that can be employed as the substrate 60 in the module 100a include various thermoset and thermoplastic materials, e.g., polyimides, suitable for mounting electronic devices 102 and possessing high mechanical integrity and flexibility when subjected to the bending associated with the foldable electronic device module 100a. For example, substrate 60 may be an organic light emitting diode ("OLED") display panel. The material selected for the substrate 60 may also exhibit a high thermal stability to resist material property changes and/or degradation associated with the application environment for the module 100a and/or its processing conditions.

The stack 90a of the foldable electronic device module 100a shown in FIG. 1 can also include one or more electronic devices 102 coupled to the flexible electronic device substrate 60. These electronic devices 102, for example, are conventional electronic devices employed in conventional OLED-containing display devices. For example, the substrate 60 of the stack 90a can include one or more electronic devices 102 in the form and structure of a touch sensor, polarizer, etc., and other electronic devices, along with adhesives or other compounds for joining these devices to the substrate 60. Further, the electronic devices 102 can be located within the substrate 60 and/or on one or more of its primary surfaces 64, 66. As also depicted in FIG. 1, the stack 90a can also include a stack element 75. The stack element 75 can include various features associated with the foldable electronic device module 100a, depending on its end use application.

Again referring to FIG. 1, the stack 90a of the foldable module 100a further includes an interlayer 75 with an interlayer thickness 76. The interlayer 75 is further characterized by an elastic modulus from about 0.01 GPa to about 10 GPa, for example, from about 0.01 GPa to about 8 GPa, from about 0.01 GPa to about 6 GPa, from about 0.01 GPa to about 4 GPa, from about 0.01 GPa to about 2 GPa, from about 0.1 GPa to about 8 GPa, from about 0.1 GPa to about 6 GPa, from about 0.1 GPa to about 4 GPa, from about 0.2 GPa to about 8 GPa, from about 0.2 GPa to about 6 GPa, from about 0.5 GPa to about 8 GPa, or any elastic modulus values or range of values between these ranges. According to some aspects of the foldable module 100a, the interlayer 75 is characterized by an elastic modulus of about 0.01 GPa, 0.02 GPa, 0.03 GPa, 0.04 GPa, 0.05 GPa, 0.06 GPa, 0.07 GPa, 0.08 GPa, 0.09 GPa, 0.1 GPa, 0.2 GPa, 0.3 GPa, 0.4 GPa, 0.5 GPa, 0.6 GPa, 0.7 GPa, 0.8 GPa, 0.9 GPa, 1 GPa, 2 GPa, 3 GPa, 4 GPa, 5 GPa, 6 GPa, 7 GPa, 8 GPa, 9 GPa, 10 GPa, or any amount or range of amounts between these elastic modulus values. In embodiments, the interlayer 75 can include one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

Aspects of the foldable modules 100a incorporate an interlayer 75 with a relatively higher elastic modulus, e.g., from about 5 GPa to about 10 GPa, as compared to the elastic modulus of conventional interlayers employed in such electronic device applications. The use of such interlayers 75 with relatively higher elastic modulus values unexpectedly provides an enhanced degree of resistance to impacts, as manifested in reduced tensile stresses observed at the primary surfaces 54, 56 of the cover element 50, upon an impact to the cover element 50 in a Pen Drop Test. Other aspects of the foldable modules 100a incorporate an interlayer 75 with a relatively lower elastic modulus, e.g., from about 0.01 GPa to about 5 GPa, as compared to the elastic modulus of conventional interlayers employed in such electronic device applications. The use of such interlayers 75 with relatively lower elastic modulus values unexpectedly provides an enhanced degree of resistance to bending, as manifested in reduced bend forces upon bending of the module 100a in a Two-Point Bend Test. Further aspects of the foldable modules 100a incorporate an interlayer 75 with a relatively higher elastic modulus, e.g., from about 5 GPa to about 10 GPa, as compared to the elastic modulus of conventional interlayers employed in such electronic device applications. The use of such interlayers 75 with relatively higher elastic modulus values unexpectedly provides an enhanced degree of bend stress resistance, as manifested in reduced tensile stresses observed at the primary surface 56 of the cover element 50, upon bending of the module 100a in a Two-Point Bend Test.

Again referring to FIG. 1, the stack 90a of the foldable module 100a further includes an interlayer 75 with an interlayer thickness 76. The interlayer 75 can be further characterized by a thickness 76 that can range from about 50 µm to about 200 µm, for example from about 50 µm to about 175 µm, from about 50 µm to about 150 µm, from about 50 µm to about 125 µm, from about 50 µm to about 100 µm, from about 50 µm to about 75 µm, from about 75 µm to about 175 µm, from about 75 µm to about 150 µm, from about 75 µm to about 125 µm, from about 75 µm to about 100 µm, from about 100 µm to about 175 µm, from about 100 µm to about 150 µm, from about 100 µm to about 125 µm, from about 125 µm to about 175 µm, from about 125 µm to about 150 µm, and from about 150 µm to about 175 µm. In other aspects, thickness 76 of the interlayer 75 can range from about 50 µm to 200 µm, from about 75 µm to 175 µm, or from about 100 µm to 150 µm. The thickness 76 of the interlayer 75 can also be set at other thicknesses or ranges of thicknesses between the foregoing ranges.

Aspects of the foldable modules 100a incorporate an interlayer 75 with a relatively higher thickness 76, e.g., from about 125 µm to about 200 µm, as compared to the thickness of conventional interlayers employed in such electronic device applications. The use of such interlayers 75 with relatively higher thickness 76 values unexpectedly provides an enhanced degree of resistance to impacts, as manifested in reduced tensile stresses observed at the primary surfaces 54, 56 of the cover element 50, upon an impact to the cover element 50 in a Pen Drop Test. Other aspects of the foldable modules 100a incorporate an interlayer 75 with a relatively lower thickness 76, from about 50 µm to about 125 µm, as compared to the thickness of conventional interlayers employed in such electronic device applications. The use of such interlayers 75 with relatively lower thickness 76 values unexpectedly provides an enhanced degree of resistance to bending and/or bend resistance, as manifested in reduced bend forces and/or tensile stresses observed at the primary surfaces 54, 56 of the cover element 50, upon bending of the module 100a in a Two-Point Bend Test.

Figure 2:
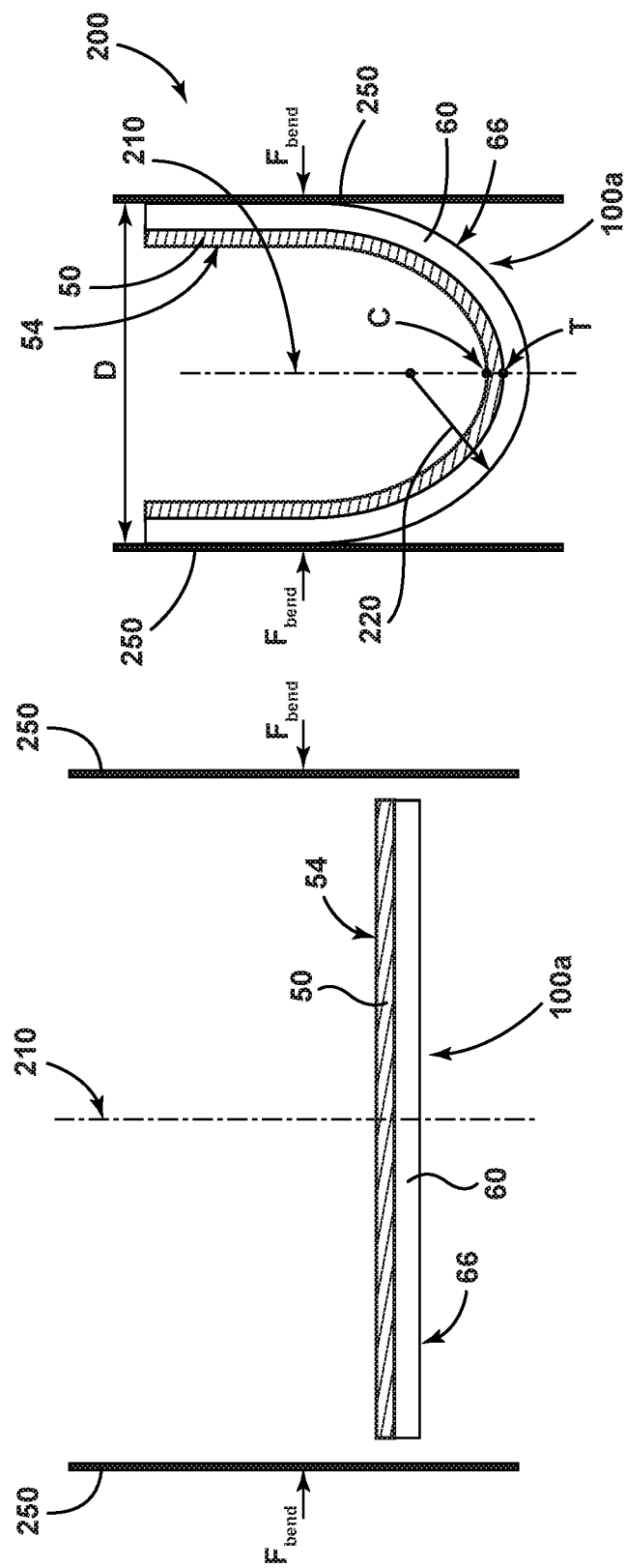
FIGS. 2A & 2B depict a foldable electronic device module in an un-bent and a bent configuration, respectively, within a Two-Point Bend Test apparatus for measuring bending resistance and bend stress resistance, according to some aspects of the disclosure.

Referring to FIGS. 2A & 2B, a foldable electronic device module 100a-c (see FIG. 1) is depicted in an un-bent and a bent configuration, respectively, within a Two-Point Bend Test apparatus 200 according to some aspects of the disclosure. It should be understood that some of the features associated with the foldable electronic device module 100a are not depicted in FIGS. 2A and 2B for purposes of clarity. In FIG. 2A, the module 100a is depicted in an un-bent configuration within the Two-Point Test apparatus 200 (see FIG. 2B, showing the test apparatus 200).

As used herein, a "Two-Point Bend Test" or "Two-Point Bending Test" is conducted with the test apparatus 200 depicted in FIGS. 2A and 2B such that two vertical plates 250 are pressed inward against the module 100a with a constant bend force, $F_{bend}$. Fixtures (not shown) associated with the test apparatus 200 ensure that the modules are bent in an upwardly concave direction as the $F_{bend}$ forces are applied to the modules via the plates 250. Referring to FIG. 2B, the plates 250 are moved together in unison until a particular bend radius 220 is achieved. In general, the bend radius 220 is about half the distance, D, between the plates 250. As outlined earlier, the foldable electronic device module 100a is characterized by stresses (primarily tensile) that occur at the second primary surface 56 (see FIG. 1) of the cover element 50 (i.e., at point "T") upon bending the module in a two-point apparatus 200 to a bend radius 220 from about 20 mm to about 2 mm such that the first primary surface 54 is in compression (i.e., at point "C"). As shown in FIG. 2B, the bend radius 220 is measured from a center point above the first primary surface 54 of the cover element 50 to the second primary surface 66 of the flexible electronic device substrate 60. This center point is located on a line of symmetry 210 associated with the module 100a.

Advantageously, the Two-Point Bend Test can be modeled using finite element analysis ("FEA") techniques.

Unless otherwise noted, the FEA modeling employed in the disclosure to simulate the stresses at the primary surfaces 54, 56 of the cover element, and the bend forces, $F_{bend}$, within the module 100a was conducted according to certain model assumptions, as understood by those with ordinary skill in the field of the disclosure. These assumptions include: the use of linear-elastic or hyper-elastic material properties for the elements of the module 100a; the use of a large deformation analysis approach; and the use of a quasi-steady state analysis approach. Further, all modeling of the Two-Point Bend Test was conducted as assuming the module 100a was at room temperature and that a very small coefficient of friction existed between the plates and the module 100a. Further, a plate spacing, D, of 6 mm was assumed for all modeled conditions, unless otherwise noted. In addition, the cover element 50 was assumed to have an elastic modulus of 71 GPa and a Poisson's ratio of 0.22. The substrate 60 was assumed to consist of an optical adhesive layer having a thickness of 50 μm, an elastic modulus of 0.3 GPa and a Poisson's ratio of 0.49; and a polyethylene terephthalate (PET) layer having a thickness of 100 μm, an elastic modulus of 3 GPa and a Poisson's ratio of 0.38.

In certain implementations of the foldable electronic device module 100a (see FIG. 1), the module can exhibit a bending resistance characterized by a bend force of less than about 110 N in the module 100a upon an estimated bending to a plate spacing of 6 mm in a Two-Point Bend Test with test apparatus 200 (see FIGS. 2A and 2B) such that the first primary surface 54 is concave. Unexpectedly, as understood through such modeling of the Two-Point Bend Test, the properties of the interlayer 75 and/or its thickness 76 can be adjusted to further enhance the bending resistance of the module 100a such that a bend force of less than about 70 N exists in the module 100a upon an estimated bending to a plate spacing of 6 mm in a Two-Point Bend Test with test apparatus 200 (see FIGS. 2A and 2B) such that the first primary surface 54 is concave. In particular, aspects of the foldable modules 100a incorporate an interlayer 75 with a lower elastic modulus, e.g., from about 0.01 GPa to about 5 GPa, as compared to the elastic modulus of conventional interlayers employed in such electronic device applications. The use of such interlayers 75 with relatively lower elastic modulus values unexpectedly provides an enhanced degree of resistance to bending, as manifested in reduced bend forces in the module 100a during the Two-Point Bend Test. Aspects of the foldable modules 100a can also incorporate an interlayer 75 with a relatively lower thickness 76, e.g., from about 50 μm to about 125 μm, as compared to the thickness of conventional interlayers employed in such electronic device applications. The use of such interlayers 75 with relatively lower thickness 76 values unexpectedly provides an enhanced degree of resistance to bending, as manifested in reduced bending forces observed in the module 100a upon bending a Two-Point Bend Test at a plate spacing of 6 mm With such modeling and design of the interlayer 75, the bending forces within the module 100a can be reduced to less than about 110 N, less than about 100 N, less than about 90 N, less than about 80 N, less than about 70 N, less than about 60 N, less than about 50 N, less than about 40 N, less than about 30 N, less than about 20N, and lower.

In additional implementations of the foldable electronic device module 100a (see FIG. 1), the module can exhibit a bend stress resistance characterized by a tensile stress of less than about 200 MPa at the second primary surface 56 of the cover element 50 upon an estimated bending to a plate spacing of 6 mm in a Two-Point Bend Test with test apparatus 200 (see FIGS. 2A and 2B) such that the first primary surface 54 is concave. Unexpectedly, as understood through such modeling of the Two-Point Bend Test, the properties of the interlayer 75 and/or its thickness 76 can be adjusted to further enhance the bend stress resistance of the module 100a such that a tensile stress of less about 150 MPa exists at the second primary surface 56 of the cover element 50 upon an estimated bending to a plate spacing of 6 mm in a Two-Point Bend Test with test apparatus 200 (see FIGS. 2A and 2B) such that the first primary surface 54 is concave. In particular, aspects of the foldable modules 100a incorporate an interlayer 75 with a lower elastic modulus, e.g., from about 0.01 GPa to about 5 GPa, as compared to the elastic modulus of conventional interlayers employed in such electronic device applications. The use of such interlayers 75 with relatively lower elastic modulus values unexpectedly provides an enhanced degree of resistance to bend stresses, as manifested in reduced tensile stresses at the second primary surface 56 of the cover element 50 during the Two-Point Bend Test. Aspects of the foldable modules 100a can also incorporate an interlayer 75 with a relatively lower thickness 76, e.g., from about 50 μm to about 125 μm, as compared to the thickness of conventional interlayers employed in such electronic device applications. The use of such interlayers 75 with relatively lower thickness 76 values unexpectedly provides an enhanced degree of resistance to bend stresses, as manifested in reduced tensile stresses observed at the second primary surface 56 of the cover element 50 upon bending a Two-Point Bend Test at a plate spacing of 6 mm. With such modeling and design of the interlayer 75, the tensile stresses at the second primary surface 56 of the cover element 50 within the module 100a can be reduced to less than about 200 MPa, less than about 190 MPa, less than about 180 MPa, less than about 170 MPa, less than about 160 MPa, less than about 150 MPa, less than about 140 MPa, less than about 130 MPa, less than about 120 MPa, less than about 110 MPa, less than about 100 MPa, less than about 90 MPa, less than about 80 MPa, less than about 70 MPa, less than about 60 MPa, less than about 50 MPa, less than about 40 MPa, less than about 30 MPa, less than about 20 MPa, less than about 10 MPa, and lower (e.g., such that this location exhibits compressive stresses).

Figure 3:
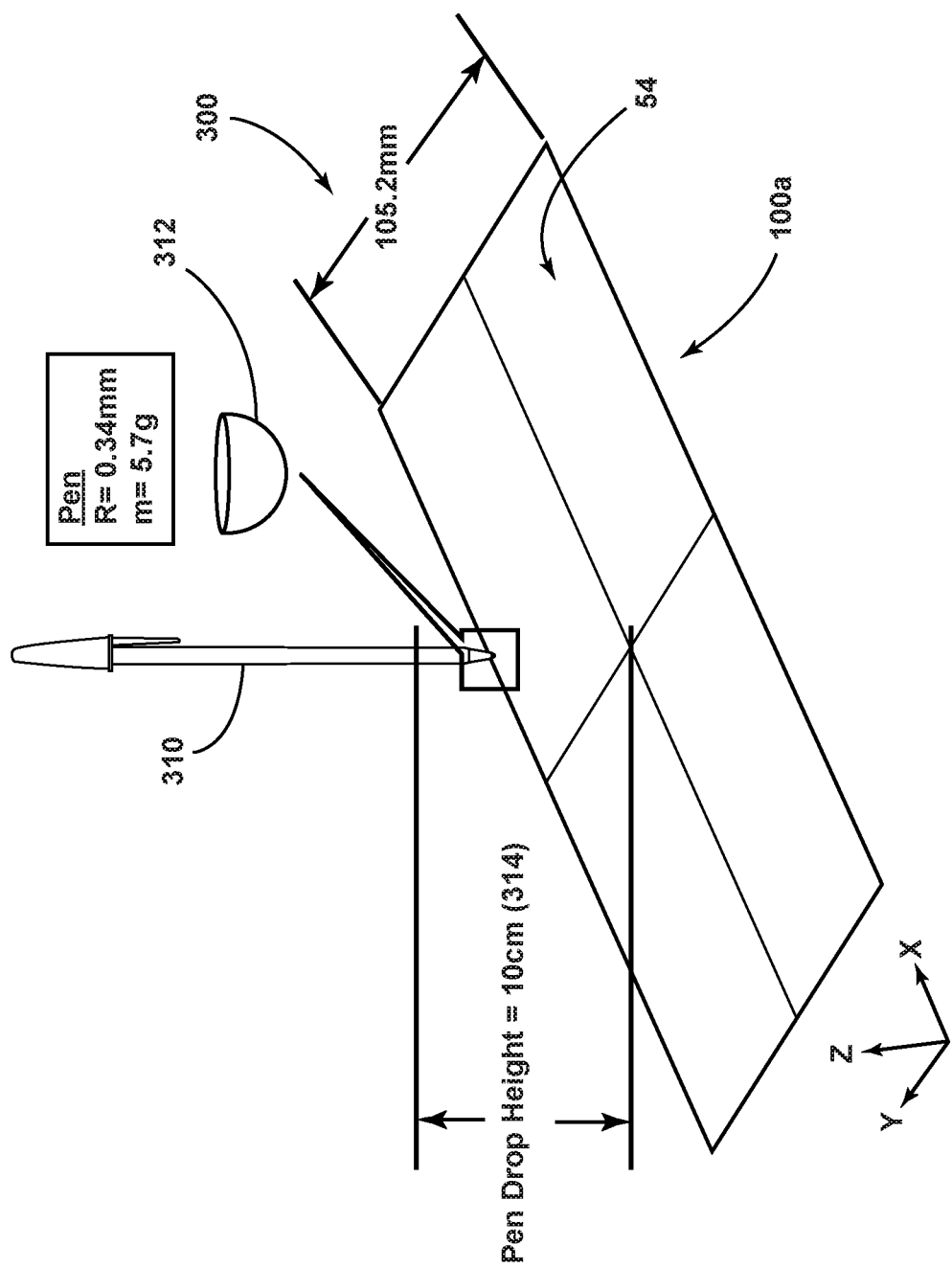
FIG. 3 depicts a foldable electronic device module within a Pen Drop Test apparatus for measuring impact resistance, according to some aspects of the disclosure.

Referring now to FIG. 3, a pen drop test apparatus 300 is depicted. As used herein, a "Pen Drop Test" was conducted with a pen drop apparatus 300 to assess the impact resistance of the foldable electronic device module 100a (see FIG. 1), as characterized by an average pen drop height before failure. As described and referred to herein, a Pen Drop Test is conducted such that foldable electronic device module 100a samples are tested with the load (i.e., from a pen dropping at a certain height) imparted to the exposed surface of the cover element 50, i.e., primary surface 54. The opposite side of the foldable electronic device module 100a, e.g., at primary surface 66 (see FIG. 1), is supported by an aluminum plate (6063 aluminum alloy, as polished to a surface roughness with 400 grit paper). One tube is used according to the Drop Test to guide the pen 310 to the sample, and the tube is placed in contact with the top surface of the sample so that the longitudinal axis of the tube is substantially perpendicular to the top surface of the sample. Each tube has an outside diameter of 2.54 cm (1 inch), an inside diameter of 1.4 cm (nine sixteenths of an inch) and a length of 90 cm. An acrylonitrile butadiene ("ABS") shim is employed to hold the pen at a desired height 314, of the ball above the first surface 54, for each test. After each drop, the tube is relocated relative to the sample to guide the pen to a different impact location on the sample. The pen 310 employed in the Pen Drop Test has a ball point tip 312 of 0.34 mm diameter, and a weight of 5.7 grams as including the cap.

According to the Pen Drop Test depicted in FIG. 3, the pen 310 is dropped with the cap attached to the top end (i.e., the end opposite the tip) so that the ball point 312 can interact with the test sample, i.e., a foldable electronic device module 100a. In a drop sequence according to the Pen Drop Test, 1 pen drop is conducted at an initial height of 1 cm, followed by successive drops in 2 cm increments to a maximum pen drop height of 90 cm. Further, after each drop is conducted, the presence of any observable fracture, failure or other evidence of damage to the foldable electronic device assembly or cover element is recorded along with the particular pen drop height. Under the Pen Drop Test, multiple samples can be tested according to the same drop sequence to generate a population with improved statistics, including the determination of an average pen drop height.

Advantageously, the Pen Drop Test depicted in FIG. 3 was modeled using FEA techniques to estimate tensile stresses generated at the primary surfaces 54, 56 of the cover element 50 based on a fixed pen drop height 314 of 10 cm. Certain assumptions were made in conducting this modeling, as further understood by those with ordinary skill in the field of the disclosure, including the use of the same material properties as noted earlier in connection with the Two-Point Bend Test modeling. With further regard to the Pen Drop Test modeling, the following additional assumptions were made: the pen tip 312 was modeled as a rigid body with no pen tip deformation; a quarter symmetry slice of a module 100a was employed; all interfaces in the module 100a were assumed to be perfectly bonded during the analysis, with no delamination; the aluminum support plate referenced in connection with the pen drop test apparatus 300 was modeled as a rigid body aluminum plate; frictionless contact was assumed between the module 100a and the aluminum support plate; it was assumed that the pen tip 312 did not penetrate the cover element 50 of the module 100a; the use of linear-elastic or hyper-elastic material properties for the elements of the module 100a; the use of a large deformation approach; and that the module 100a was at room temperature during the simulated testing.

In certain implementations of the foldable electronic device module 100a (see FIG. 1), the module can exhibit an impact resistance characterized by a tensile stress of less than about 4100 MPa at the first primary surface 54 of the cover element 50 and a tensile stress of less than about 8300 MPa at the second primary surface 56 of the cover element 50 upon an impact to the cover element in a Pen Drop Test, as modeled with a pen drop height 314 of 10 cm (see FIG. 3). Unexpectedly, as understood through such modeling of the Pen Drop Test, the properties of the interlayer 75 and/or its thickness 76 can be adjusted to further enhance the impact resistance of the module 100a such that a tensile stress of less than about 3900 MPa at the first primary surface 54 of the cover element 50 and a tensile stress of less than about 7000 MPa at the second primary surface 56 of the cover element 50 upon an impact to the cover element in a Pen Drop Test. In particular, aspects of the foldable modules 100a incorporate an interlayer 75 with a relatively higher elastic modulus, e.g., from about 5 GPa to about 10 GPa, as compared to the elastic modulus of conventional interlayers employed in such electronic device applications. The use of such interlayers 75 with relatively higher elastic modulus values unexpectedly provides an enhanced degree of resistance to impacts, as manifested in reduced tensile stresses observed at the primary surfaces 54, 56 of the cover element 50, upon an impact to the cover element 50 in a Pen Drop Test. Aspects of the foldable modules 100a can also incorporate an interlayer 75 with a relatively higher thickness 76, e.g., from about 125 µm to about 200 µm, as compared to the thickness of conventional interlayers employed in such electronic device applications. The use of such interlayers 75 with relatively higher thickness 76 values unexpectedly provides an enhanced degree of resistance to impacts, as manifested in reduced tensile stresses observed at the primary surfaces 54, 56 of the cover element 50, upon an impact to the cover element 50 in a Pen Drop Test. With such modeling and design of the interlayer 75, the tensile stresses at the first primary surface 54 of the cover element 50 can be reduced to less than about 4100 MPa, 4000 MPa, 3900 MPa, 3800 MPa, 3700 MPa, 3600 MPa, 3500 MPa, 3400 MPa, 3300 MPa, 3200 MPa, 3100 MPa, 3000 MPa, and lower. Similarly, the tensile stresses at the second primary surface 56 of the cover element 50 can be reduced to less than about 8300 MPa, 8000 MPa, 7500 MPa, 7000 MPa, 6500 MPa, 6000 MPa, 5500 MPa, 5000 MPa, 4500 MPa, 4000 MPa, 3500 MPa, 3000 MPa, and lower.

Still referring to FIG. 1, the cover element 50 of the foldable electronic device module 100a can, in certain aspects of the disclosure, comprise a glass layer or component with one or more compressive stress regions (not shown) that extend from the first and/or second primary surfaces 54, 56 to a selected depth in the cover element 50. Further, in certain aspects of the module 100a, edge compressive stress regions (not shown) that extend from edges of the element 50 (e.g., as normal or substantially normal to primary surfaces 54, 56) to a selected depth can also be developed. For example, the compressive stress region or regions (and/or edge compressive stress regions) contained in a glass cover element 50 can be formed with an ion-exchange ("IOX") process. As another example, a glass cover element 50 can comprise various tailored glass layers and/or regions that can be employed to develop one or more such compressive stress regions through a mismatch in coefficients of thermal expansion ("CTE") associated with the layers and/or regions.

In those aspects of the device module 100a with a cover element 50 having one or more compressive stress regions formed with an IOX process, the compressive stress region(s) can include a plurality of ion-exchangeable metal ions and a plurality of ion-exchanged metal ions, the ion-exchanged metal ions selected so as to produce compressive stress in the compressive stress region(s). In some aspects of the module 100a containing compressive stress region(s), the ion-exchanged metal ions have an atomic radius larger than the atomic radius of the ion-exchangeable metal ions. The ion-exchangeable ions (e.g., $Na^+$ ions) are present in the glass cover element 50 before being subjected to the ion exchange process. Ion-exchanging ions (e.g., $K^+$ ions) can be incorporated into the glass cover element 50, replacing some of the ion-exchangeable ions within region(s) within the element 50 that ultimately become the compressive stress region(s). The incorporation of ion-exchanging ions, for example, $K^+$ ions, into the cover element 50 can be effected by submersing the element 50 (e.g., prior to formation of the complete module 100a) in a molten salt bath containing ion-exchanging ions (e.g., molten $KNO_3$ salt). In this example, the $K^+$ ions have a larger atomic radius than the $Na^+$ ions and tend to generate local compressive stress in the glass cover element 50 wherever present, e.g., in the compressive stress region(s).

Depending on the ion-exchanging process conditions employed for the cover element 50 employed in the foldable electronic device module 100a depicted in FIG. 1, the ion-exchanging ions can be imparted from the first primary surface 54 of the cover element 50 down to a first ion exchange depth (not shown, "DOL"), establishing an ion exchange depth-of-compression ("DOC"). As used herein, DOC means the depth at which the stress in the chemically strengthened alkali aluminosilicate glass article described herein changes from compressive to tensile. DOC may be measured by surface stress meter (FSM—using commercially available instruments such as the FSM-6000, manufactured by Orihara Industrial Co., Ltd. (Japan)) or a scattered light polariscope (SCALP) depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM. Compressive stress (including surface CS) is measured by FSM. Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety. Similarly, a second compressive stress region can be developed in the element 50 from the second primary surface 56 down to a second ion exchange depth. Compressive stress levels within the DOC that far exceed 100 MPa can be achieved with such IOX processes, up to as high as 2000 MPa. The compressive stress levels in the compressive stress region(s) within the cover element 50 can serve to offset tensile stresses generated in the cover element 50 upon bending of the foldable electronic device module 100a.

Referring again to FIG. 1, the foldable electronic device module 100a can, in some implementations, include one or more edge compressive stress regions in the cover element 50 at edges that are normal to the first and second primary surfaces 54, 56, each defined by a compressive stress of 100 MPa or more. It should be understood that such edge compressive stress regions can be developed in the cover element 50 at any of its edges or surfaces distinct from its primary surfaces, depending on the shape or form of element 50. For example, in some implementations of foldable module 100a having an elliptical-shaped cover element 50, edge compressive stress regions can be developed inward from the outer edge (of the element) that is normal (or substantially normal) to the primary surfaces of the element. IOX processes that are similar in nature to those employed to generate the compressive stress region(s) in proximity to the primary surfaces 54, 56 can be deployed to produce these edge compressive stress regions. More specifically, any such edge compressive stress regions in the cover element 50 can be used to offset tensile stresses generated at the edges of the element through, for example, bending of the cover element 50 (and module 100a) across any of its edges and/or non-uniform bending of the cover element 50 at its primary surfaces 54, 46. Alternatively, or as an addition thereto, without being bound by theory, any such edge compressive stress regions employed in the cover element 50 may offset adverse effects from an impact or abrasion event at or to the edges of the element 50 within the module 100a.

Referring again to FIG. 1, in those aspects of the device module 100a with a cover element 50 having one or more compressive stress regions formed through a mismatch in CTE of regions or layers within the element 50, these compressive stress regions are developed by tailoring of the structure of the element 50. For example, CTE differences within the element 50 can produce one or more compressive stress regions within the element. In one example, the cover element 50 can comprise a core region or layer that is sandwiched by clad regions or layers, each substantially parallel to the primary surfaces 54, 56 of the element. Further, the core layer is tailored to a CTE that is greater than the CTE of the clad regions or layers (e.g., by compositional control of the core and clad layers or regions). After the cover element 50 is cooled from its fabrication processes, the CTE differences between the core region or layer and the clad regions or layers cause uneven volumetric contraction upon cooling, leading to the development of residual stress in the cover element 50 manifested in the development of compressive stress regions below the primary surfaces 54, 56 within the clad region or layers. Put another way, the core region or layer and the clad regions or layers are brought into intimate contact with one another at high temperatures; and these layers or regions are then cooled to a low temperature such that the greater volume change of the high CTE core region (or layer) relative to the low CTE clad regions (or layers) creates the compressive stress regions in the clad regions or layers within the cover element 50.

Still referring to the cover element 50 in the module 100a that is depicted in FIG. 1 with CTE-developed compressive stress regions, the CTE-related compressive stress regions reach from the first primary surface 54 down to a first CTE region depth and the second primary surface 56 to a second CTE region depth, respectively, thus establishing CTE-related DOCs for each of the compressive stress regions associated with the respective primary surfaces 54, 56 and within the clad layer or regions. In some aspects, the compressive stress levels in these compressive stress regions can exceed 150 MPa. Maximizing the difference in CTE values between the core region (or layer) and the clad regions (or layers) can increase the magnitude of the compressive stress developed in the compressive stress regions upon cooling of the element 50 after fabrication. In certain implementations of the foldable electronic device module 100a with a cover element 50 having such CTE-related compressive stress regions, the cover element 50 employs a core region and clad regions with a thickness ratio of greater than or equal to 3 for the core region thickness divided by the sum of the clad region thicknesses. As such, maximizing the size of the core region and/or its CTE relative to the size and/or CTE of the clad regions can serve to increase the magnitude of the compressive stress levels observed in the compressive stress regions of the foldable module 100a.

Among other advantages, the compressive stress regions (e.g., as developed through the IOX— or CTE-related approaches outlined in the foregoing paragraphs) can be employed within the cover element 50 to offset tensile stresses generated in the element upon bending of the foldable module 100a, particularly tensile stresses that reach a maximum on one of the primary surfaces 54, 56, depending on the direction of the bend. In certain aspects, the compressive stress region can include a compressive stress of about 100 MPa or more at the primary surfaces 54, 56 of the cover element 50. In some aspects, the compressive stress at the primary surfaces is from about 600 MPa to about 1000 MPa. In other aspects, the compressive stress can exceed 1000 MPa at the primary surfaces, up to 2000 MPa, depending on the process employed to produce the compressive stress in the cover element 50. The compressive stress can also range from about 100 MPa to about 600 MPa at the primary surfaces of the element 50 in other aspects of this disclosure. In additional aspects, the compressive stress region (or regions) within the cover element 50 of the module 100a can exhibit a compressive stress from about 100 MPa to about 2000 MPa, for example, from about 100 MPa to about 1500 MPa, from about 100 MPa to about 1000 MPa, from about 100 MPa to about 800 MPa, from about 100 MPa to about 600 MPa, from about 100 MPa to about 400 MPa, from about 100 MPa to about 200 MPa, from about 200 MPa to about 1500 MPa, from about 200 MPa to about 1000 MPa, from about 200 MPa to about 800 MPa, from about 200 MPa to about 600 MPa, from about 200 MPa to about 400 MPa, from about 400 MPa to about 1500 MPa, from about 400 MPa to about 1000 MPa, from about 400 MPa to about 800 MPa, from about 400 MPa to about 600 MPa, from about 600 MPa to about 1500 MPa, from about 600 MPa to about 1000 MPa, from about 600 MPa to about 800 MPa, from about 800 MPa to about 1500 MPa, from about 800 MPa to about 1000 MPa, and from about 1000 MPa to about 1500 MPa.

Within such a compressive stress region employed in the cover element 50 of a foldable electronic device module 100a, the compressive stress can stay constant, decrease or increase as a function of depth from the primary surfaces down to one or more selected depths. As such, various compressive stress profiles can be employed in the compressive stress region. Further, the depth of each of the compressive stress regions can be set at approximately 15 µm or less from the primary surfaces 54, 56 of the cover element 50. In other aspects, the depth of the compressive stress region(s) can be set such that they are approximately ⅓ of the thickness 52 of the cover element 50 or less, or 20% of the thickness 52 of the cover element 50 or less, from the first and/or second primary surfaces 54, 56.

Referring again to FIG. 1, the foldable electronic device module 100a can include a cover element 50 comprising a glass material having one or more compressive stress regions with a maximum flaw size of 5 µm or less at the first and/or second primary surfaces 54, 56. The maximum flaw size can also be held to about 2.5 µm or less, 2 µm or less, 1.5 µm or less, 0.5 µm or less, 0.4 µm or less, or even smaller flaw size ranges. Reducing the flaw size in the compressive stress region of a glass cover element 50 can further reduce the propensity of the element 50 to fail by crack propagation upon the application of tensile stresses by virtue of bending and/or impact-related forces to the foldable module 100a (see FIGS. 2A, 2B and 3). In addition, some aspects of the foldable device module 100a can include a surface region with a controlled flaw size distribution (e.g., flaw sizes of 0.5 µm or less at the first and/or second primary surfaces 54, 56) without employing one or more compressive stress regions.

Again referring to FIG. 1, other implementations of the foldable electronic device module 100a can include a cover element 50 comprising a glass material subjected to various etching processes that are tailored to reduce the flaw sizes and/or improve the flaw distribution within the element 50. These etching processes can be employed to control the flaw distributions within the cover element 50 in close proximity to its primary surfaces 54, 56, and/or along its edges (not shown). For example, an etching solution containing about 15 vol % HF and 15 vol % HCl can be employed to lightly etch the surfaces of a cover element 50 having a glass composition. The time and temperature of the light etching can be set, as understood by those with ordinary skill, according to the composition of the element 50 and the desired level of material removal from the surfaces of the cover element 50. It should also be understood that some surfaces of the element 50 can be left in an un-etched state by employing masking layers or the like to such surfaces during the etching procedure. More particularly, this light etching can beneficially improve the strength of the cover element 50. In particular, cutting or singulatling processes employed to section the glass structure that is ultimately employed as the cover element 50 can leave flaws and other defects within the surfaces of the element 50. These flaws and defects can propagate and cause glass breakage during the application of stresses to the module 100a containing the element 50 from the application environment and usage. The selective etching process, by virtue of lightly etching one or more edges of the element 50, can remove at least some of the flaws and defects, thereby increasing the strength and/or fracture resistance of the lightly-etched surfaces. Additionally, or alternatively, a light etching step may be performed after chemical tempering (e.g., ion exchange) of the cover element 50. Such light etching after chemical tempering may reduce any flaws introduced by the chemical tempering process itself and thus may increase the strength and/or fracture resistance of the cover element.

It should also be understood that the cover element 50 employed in the foldable module 100a depicted in FIG. 1 can include any one or more of the foregoing strength-enhancing features: (a) IOX-related compressive stress regions; (b) CTE-related compressive stress regions; and (c) etched surfaces with smaller defect sizes. These strength-enhancing features can be used to offset or partially offset tensile stresses generated at the surfaces of the cover element 50 associated with the application environment, usage and processing of the foldable electronic device module 100a.

In some implementations, the foldable electronic device module 100a depicted in FIG. 1 can be employed in a display, printed circuit board, housing or other features associated with an end product electronic device. For example, the foldable module 100a can be employed in an electronic display device containing numerous thin film transistors ("TFTs") or in an LCD or OLED device containing a low-temperature polysilicon ("LTPS") backplane. When the foldable module 100a is employed in a display, for example, the module 100a can be substantially transparent. Further, the module 100a can have pencil hardness, bend radius, puncture resistance and/or designed bending force capabilities as described in the foregoing paragraphs. In some implementations, the foldable electronic device module 100a is employed in a wearable electronic device, for example, a watch, wallet or bracelet. As defined herein, "foldable" includes complete folding, partial folding, bending, flexing, discrete bends, and multiple-fold capabilities; further the device can be folded so that the display is either on the outside of the device when folded, or the inside of the device when folded.

Examples

A four-factor, design of experiments (DOE) model was employed in conducting modeling with the Pen Drop Test (with a pen drop height of 10 cm) and Two-Point Bend Test (with plate spacing of 6 mm) of impact resistance, bend resistance and resistance to bend stresses of foldable electronic device modules 100a (see FIG. 1) according to a center composite design (CCD), as shown below in Table 1. In particular, foldable electronic device modules 100a were modeled according to the interlayer 75 and first adhesive 10a attributes set forth below in Table 1. Further, the modeling conditions and assumptions outlined earlier in connection with the Pen Drop Test and Two-Point Bend Test were employed in the DOE-CCD model outlined in Table 1.

TABLE 1

| Sample | First Adhesive Thickness (μm) | Interlayer Thickness (μm) | First Adhesive Elastic Modulus (GPa) | Interlayer Elastic Modulus (GPa) |
|---|---|---|---|---|
| 1 | 5 | 50 | 0.001 | 0.01 |
| 2 | 5 | 50 | 0.001 | 10 |
| 3 | 5 | 50 | 10 | 0.01 |
| 4 | 5 | 50 | 10 | 10 |
| 5 | 5 | 200 | 0.001 | 0.01 |
| 6 | 5 | 200 | 0.001 | 10 |
| 7 | 5 | 200 | 10 | 0.01 |
| 8 | 5 | 200 | 10 | 10 |
| 9 | 25 | 50 | 0.001 | 0.01 |
| 10 | 25 | 50 | 0.001 | 10 |
| 11 | 25 | 50 | 10 | 0.01 |
| 12 | 25 | 50 | 10 | 10 |
| 13 | 25 | 200 | 0.001 | 0.01 |
| 14 | 25 | 200 | 0.001 | 10 |
| 15 | 25 | 200 | 10 | 0.01 |
| 16 | 25 | 200 | 10 | 10 |
| 17 | 15 | 125 | 5.0005 | 5.0005 |
| 18 | 15 | 125 | 5.0005 | 5.0005 |
| 19 | 5 | 125 | 5.0005 | 5.0005 |
| 20 | 25 | 125 | 5.0005 | 5.0005 |
| 21 | 15 | 50 | 5.0005 | 5.0005 |
| 22 | 15 | 200 | 5.0005 | 5.0005 |
| 23 | 15 | 125 | 0.001 | 5.0005 |
| 24 | 15 | 125 | 10 | 5.0005 |
| 25 | 15 | 125 | 5.0005 | 0.01 |
| 26 | 15 | 125 | 5.0005 | 10 |

Figure 4A:
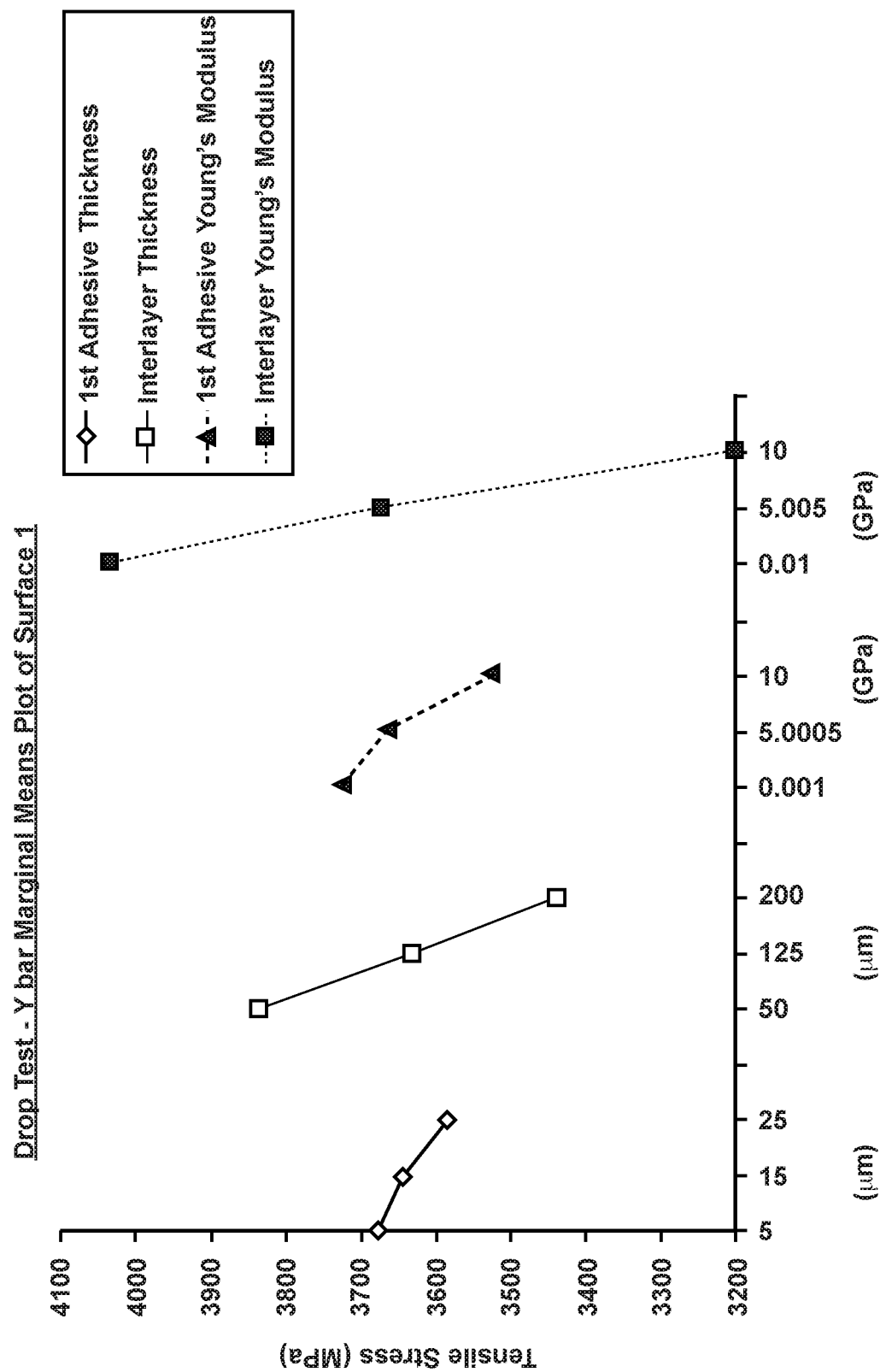
FIGS. 4A and 4B are marginal means and Pareto plots of simulated tensile stresses generated at the first primary surface of the cover element of a foldable electronic device module upon an impact to the cover element in a Pen Drop Test, according to some aspects of the disclosure.
Figure 4B:
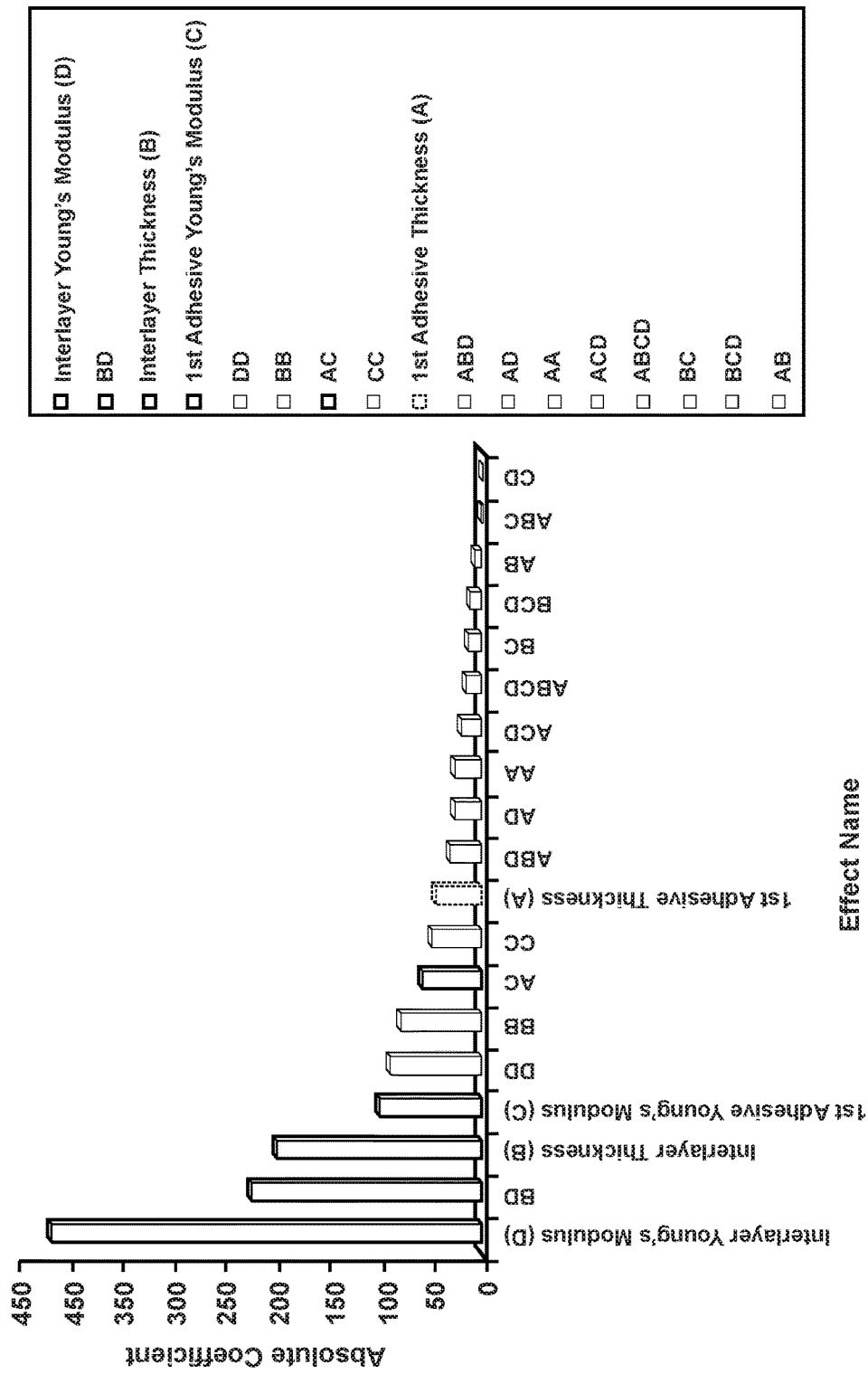

Referring to FIGS. 4A and 4B, marginal means and Pareto plots are provided of simulated tensile stresses generated at the first primary surface 54 of the cover element 50 of a foldable electronic device module 100a (see FIG. 1) upon an impact to the cover element 50 in a Pen Drop Test at a pen drop height of 10 cm. As is evident from these figures, the tensile stresses are particularly sensitive to the thickness and elastic modulus of the interlayer, such that increases in these attributes tend to reduce the tensile stress at this location. Increases in the elastic modulus of the first adhesive also have a similar effect, albeit to a lesser extent. Advantageously, this information can be employed to design the impact resistance of the foldable electronic device modules 100a of the disclosure.

Figure 4C:
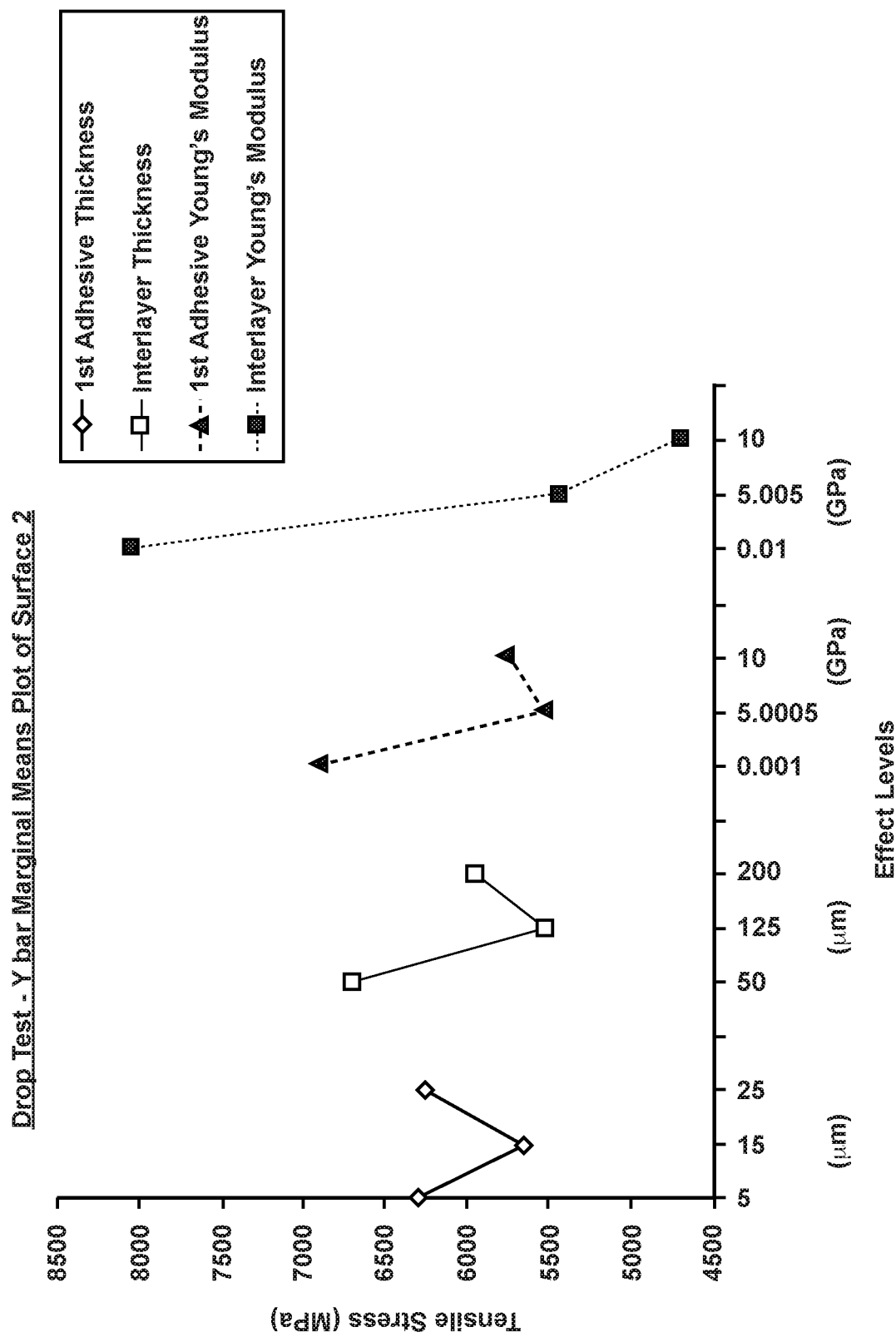
FIGS. 4C and 4D are marginal means and Pareto plots of simulated tensile stresses generated at the second primary surface of the cover element of a foldable electronic device module upon an impact to the cover element in a Pen Drop Test, according to some aspects of the disclosure.
Figure 4D:
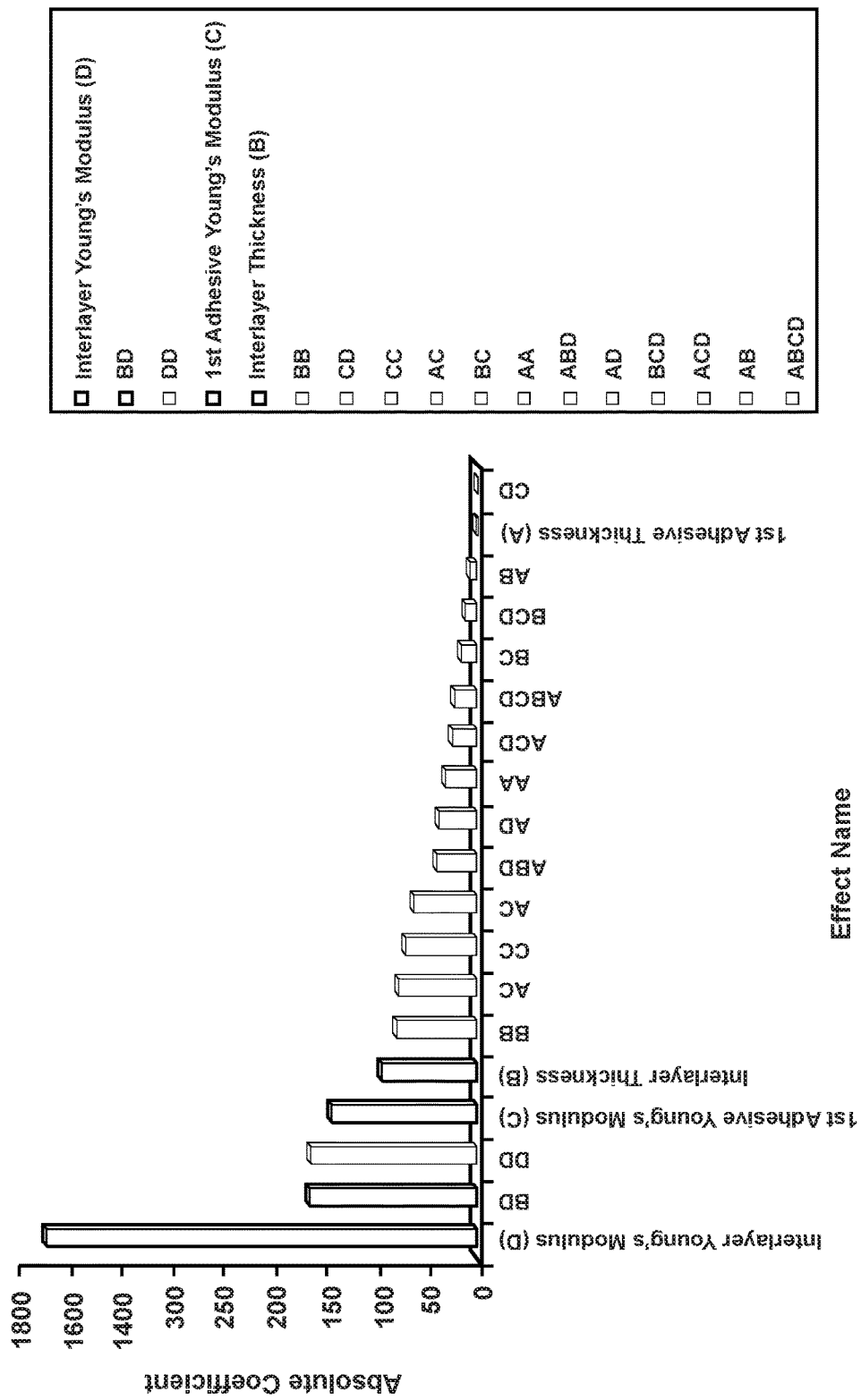

Referring now to FIGS. 4C and 4D, marginal means and Pareto plots are provided of simulated tensile stresses generated at the second primary surface 56 of the cover element 50 of a foldable electronic device module 100a (see FIG. 1) upon an impact to the cover element 50 in a Pen Drop Test at a pen drop height of 10 cm. As is evident from these figures, the tensile stresses are particularly sensitive to the thickness and elastic modulus of the interlayer, such that increases in these attributes tend to reduce the tensile stress at this location. Increases in the elastic modulus of the first adhesive also have a similar effect, albeit to a lesser extent. Advantageously, this information can be employed to design the impact resistance of the foldable electronic device modules 100a of the disclosure.

Figure 5A:
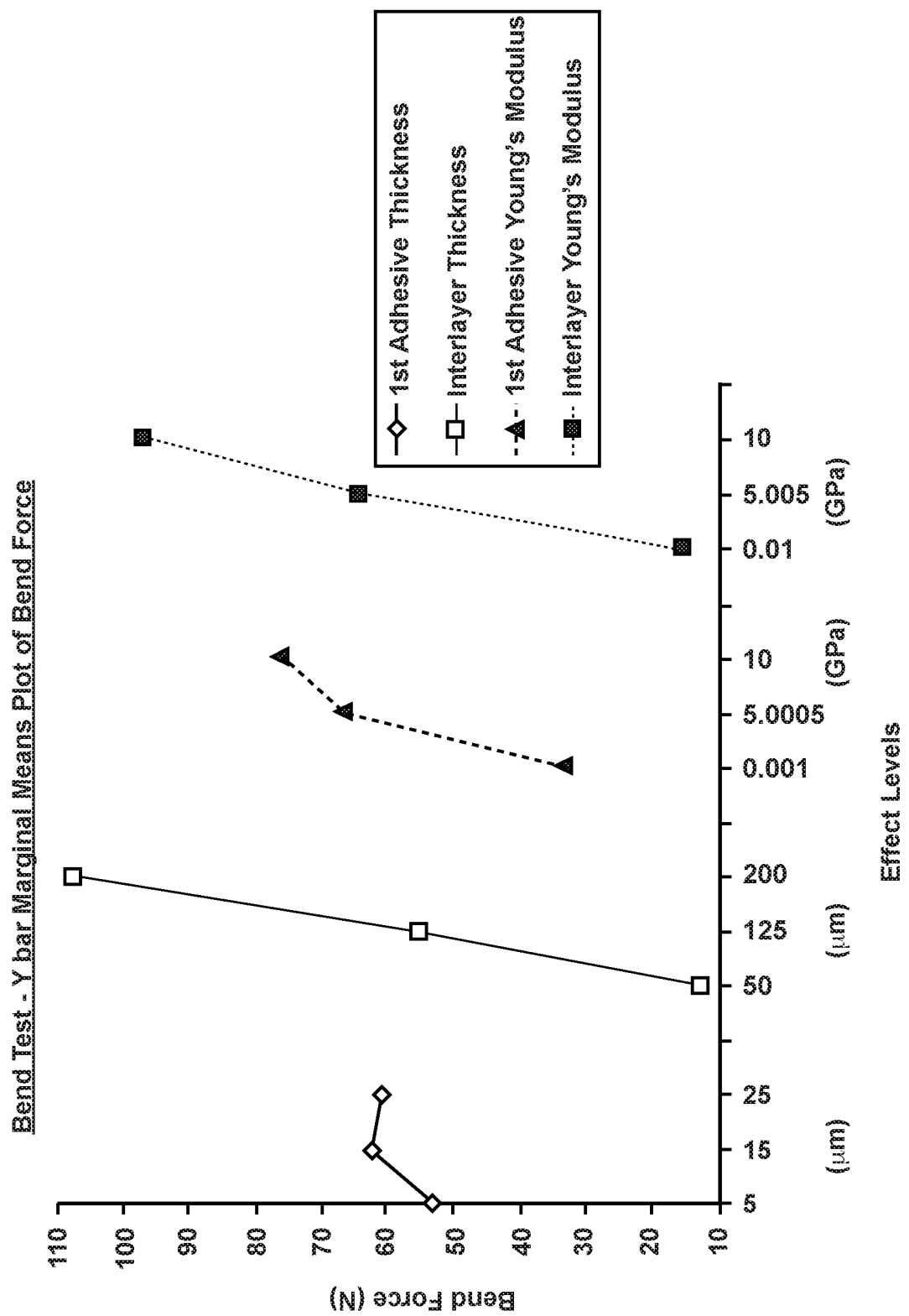
FIGS. 5A and 5B are marginal means and Pareto plots of simulated bend forces generated at the first primary surface of the cover element of a foldable electronic device module upon bending the module in a Two-Point Bend Test such that the first primary surface of the cover element is concave, according to some aspects of the disclosure.
Figure 5B:
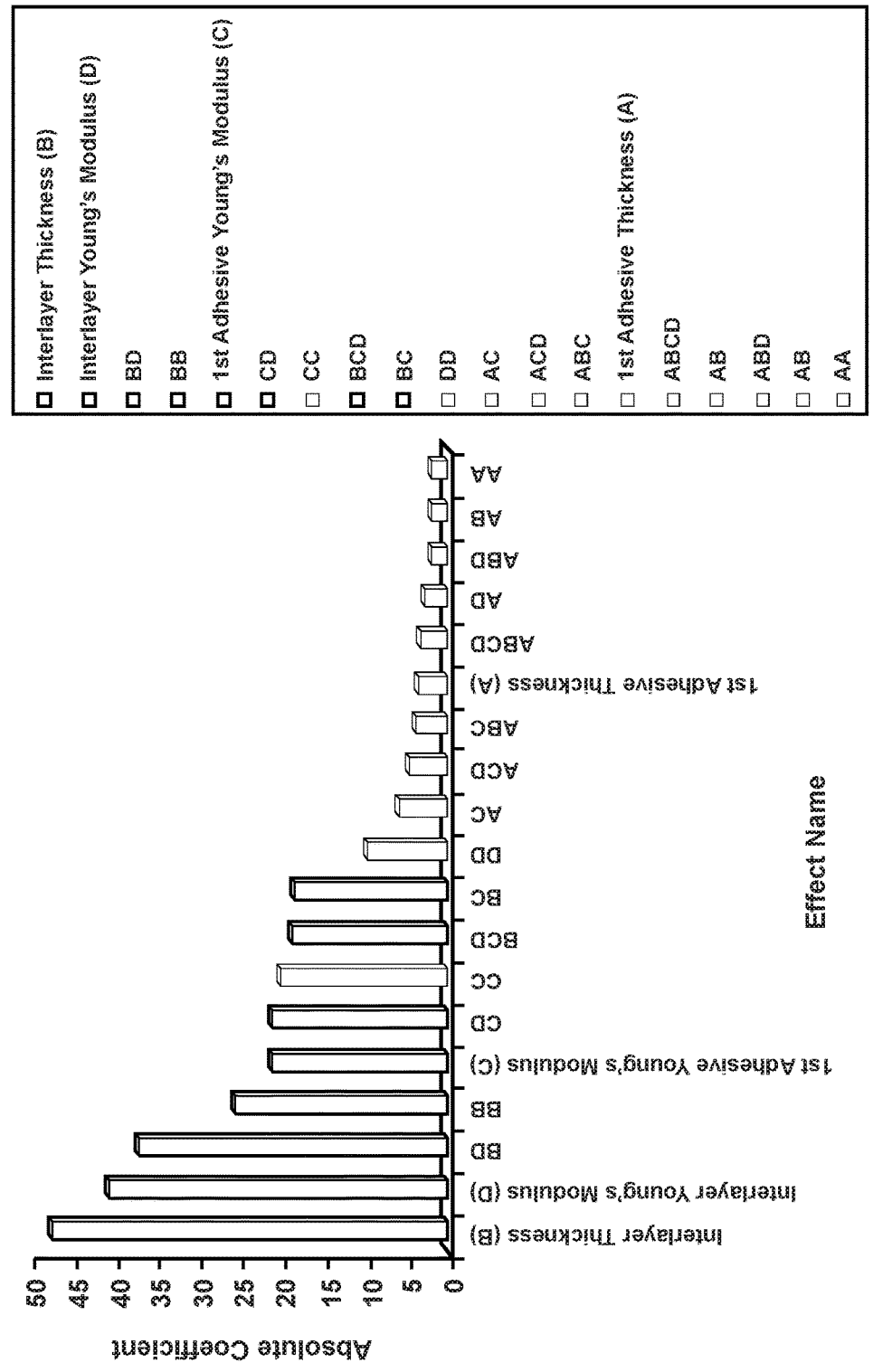

Referring now to FIGS. 5A and 5B, marginal means and Pareto plots are provided of simulated bend forces generated at the first primary surface 54 of the cover element 50 of a foldable electronic device module 100a (see FIG. 1) upon bending the module in a Two-Point Bend Test such that the first primary surface 54 of the cover element 50 is concave and with a parallel plate spacing of 6 cm (i.e., a bend radius of about 3 cm). As is evident from these figures, the bend forces are particularly sensitive to the thickness and elastic modulus of the interlayer, such that decreases in these attributes tend to reduce the bending forces in the module. Decreases in the elastic modulus of the first adhesive also have a similar effect, but to a lesser extent. Advantageously, this information can be employed to design the bending resistance of the foldable electronic device modules 100a of the disclosure.

Figure 6A:
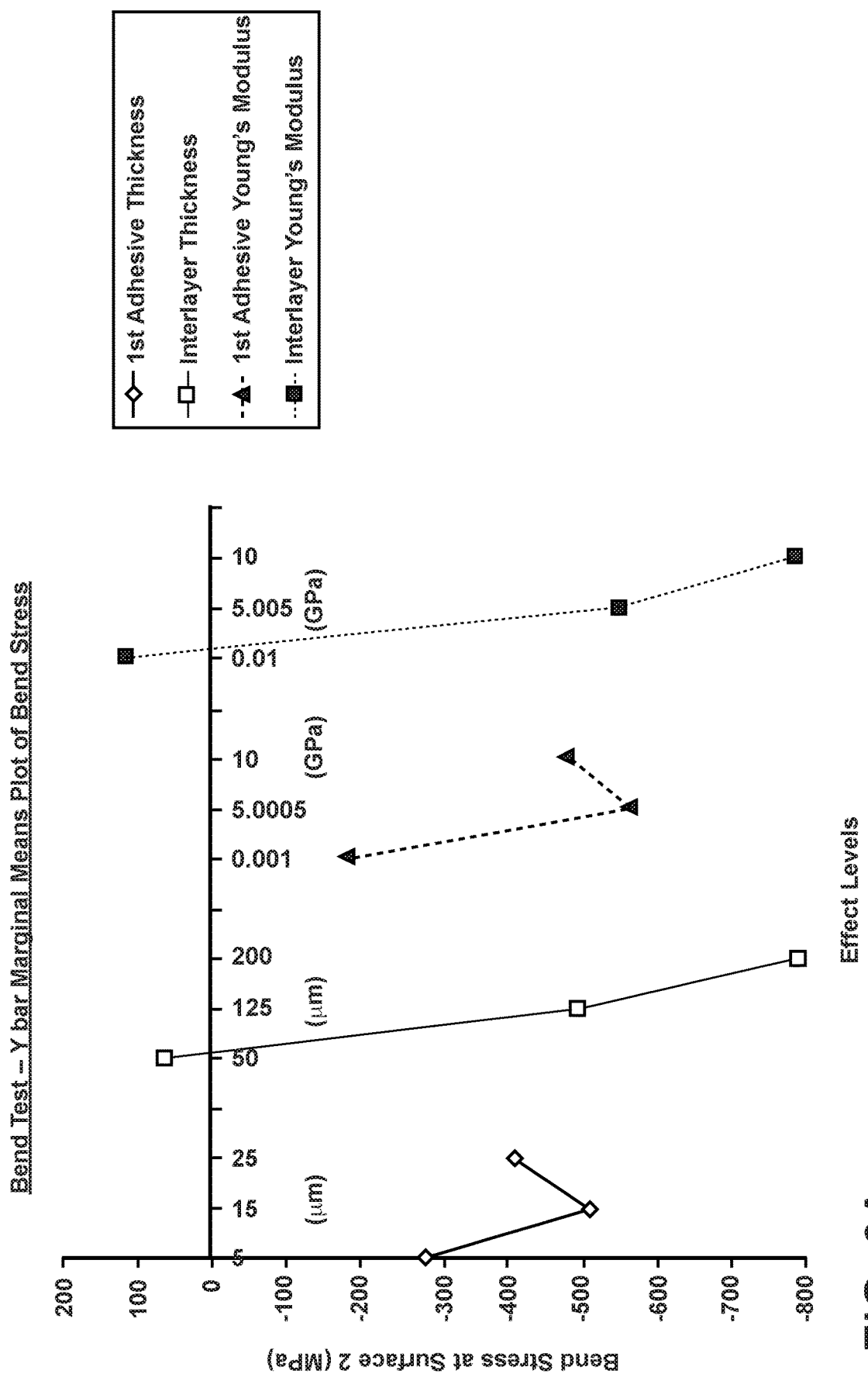
FIGS. 6A and 6B are marginal means and Pareto plots of simulated tensile stresses generated at the second primary surface of the cover element of a foldable electronic device module upon bending the cover element in a Two-Point Bend Test, according to some aspects of the disclosure.
Figure 6B:
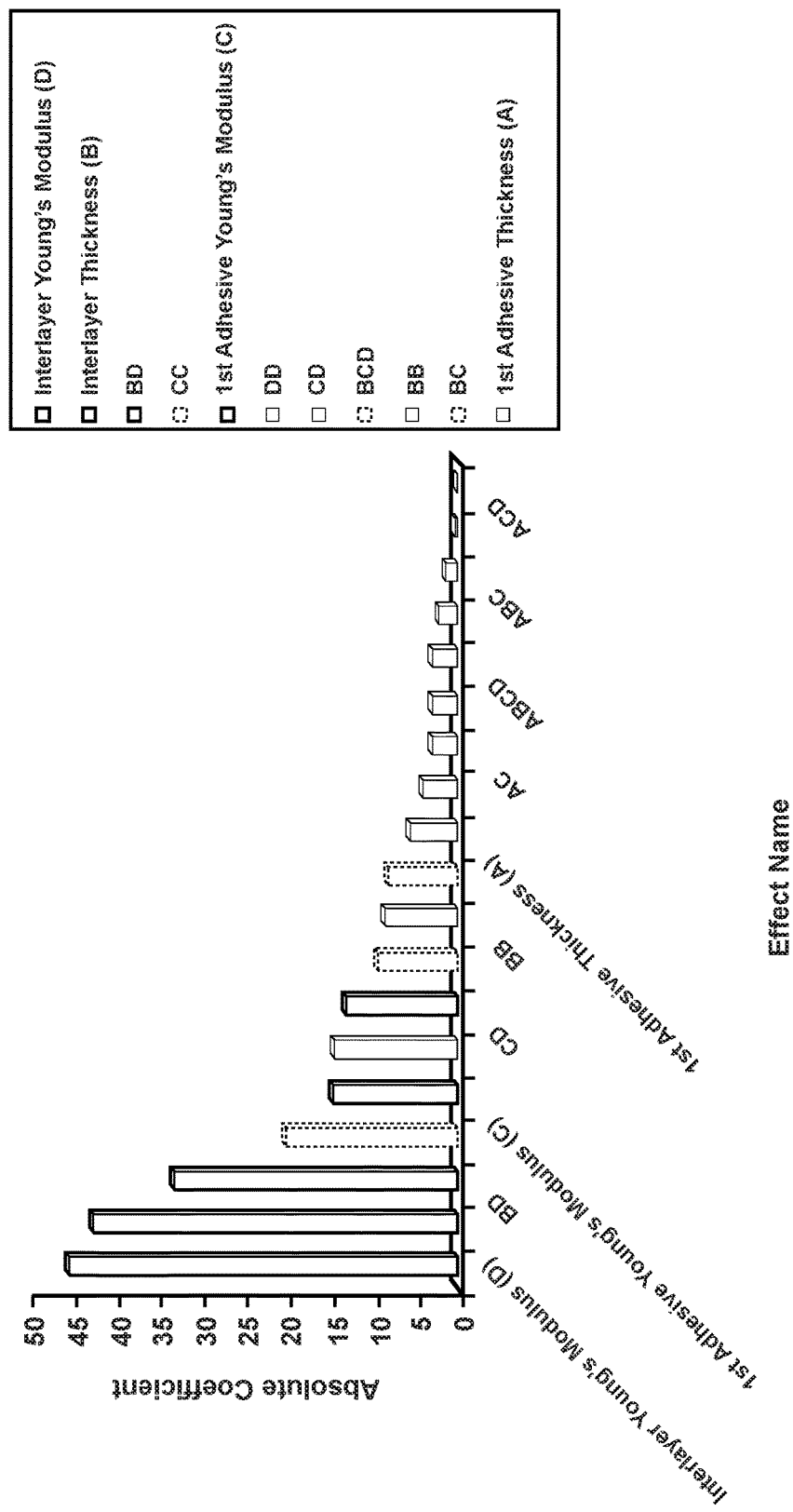

Referring now to FIGS. 6A and 6B, marginal means and Pareto plots are provided of simulated tensile stresses generated at the second primary surface 56 of the cover element 50 of a foldable electronic device module 100a upon bending the cover element in a Two-Point Bend Test such that the first primary surface 54 of the cover element 50 is concave and with a parallel plate spacing of 6 cm. As is evident from these figures, the tensile stresses associated with bending are particularly sensitive to the thickness and elastic modulus of the interlayer, such that increases in these attributes tend to reduce the bending-related tensile stresses at the second primary surface of the cover element 50. Increases in the elastic modulus of the first adhesive also have a similar effect, but to a lesser degree. Advantageously, this information can be employed to design the bending resistance of the foldable electronic device modules 100a of the disclosure.

It should also be recognized FIGS. 4A-6B demonstrate that the thicknesses and elastic modulus of the first adhesive do play a role in the impact resistance, bend stress-related resistance and bending resistance of these modules, but not as significant an impact as the thickness and elastic modulus of the interlayer. It is also evident that the thicknesses and elastic modulus of the interlayer tend to have the opposite effect in terms of resistance to bending, on the one hand, and impact resistance and bend stress-related resistance, on the other hand. Accordingly, the results from the DOE-CCD model in Table 1, as depicted in the plots of FIGS. 4A-6B, can be employed to design the impact resistance, bending resistance and bend stress-related resistance properties of the foldable electronic device modules 100a (see FIG. 1) by modifying and adjusting the dimensions and properties of the components of these modules, particularly their interlayers 75 and first adhesives 10a.

Referring now to Table 2 below, the modeling work in this example (i.e., as detailed earlier in the DOE-CCD model of Table 1) can be employed to design the configuration of the foldable electronic device modules 100a of the disclosure to minimize the tensile stresses observed at the primary surfaces 54, 56 from simulated impacts associated with the Pen Drop Test. As shown in Table 2, a 'baseline' module 100a with a first adhesive layer thickness of 10.83 μm, interlayer thickness of 108.75 μm and interlayer modulus of 1.845 GPa exhibits tensile stresses a the first and second primary surfaces 54, 56 of 3949 MPa and 7210 MPa, respectively. As is evident from Table 2, a module 100a with an increased interlayer elastic modulus of 10 GPa, a reduced interlayer thickness of 73.97 μm and an increased first adhesive thickness of 25 μm results in 10% and 13% reductions in the tensile stresses observed at the primary surfaces 54, 56 for the same impact condition in the Pen Drop Test. Further, for applications wherein it is desired to have further reductions of 15% and 20% at the primary surface 54, the first adhesive layer thickness, interlayer thickness and interlayer elastic modulus can be designed as listed in the Module Samples #3 and #4 configurations to achieve these results.

TABLE 2

| Module Sample# | Adhesive Layer Thickness (μm) | Interlayer Thickness (μm) | Adhesive Layer Modulus (GPa) | Interlayer Modulus (GPa) | Tensile Stress at Primary Surface 54 (MPa) | Tensile Stress at Primary Surface 56 (MPa) | Stress Reduction at Surface 54 (%) | Stress Reduction at Surface 56 (%) |
|---|---|---|---|---|---|---|---|---|
| 1 | 10.828 | 108.75 | 0.001 | 1.845 | 3949 | 7210 | 0 | 0 |
| 2 | 25 | 73.97 | 0.001 | 10 | 3554 | 6293 | 10 | 13 |
| 3 | 25 | 105.35 | 0.001 | 10 | 3357 | 5913 | 15 | 18 |
| 4 | 20.128 | 136.30 | 0.001 | 10 | 3159 | 5543 | 20 | 23 |

Referring now to Table 3 below, the modeling work in this example (i.e., as detailed earlier in the DOE-CCD model of Table 1) can be employed in another approach to design the configuration of the foldable electronic device modules 100a of the disclosure to minimize the tensile stresses observed at the primary surfaces 54, 56 from simulated impacts associated with the Pen Drop Test. As shown in Table 3, a 'baseline' module 100a with a first adhesive layer thickness of 10.83 μm, interlayer thickness of 108.75 μm and interlayer modulus of 1.845 GPa exhibits tensile stresses a the first and second primary surfaces 54, 56 of 3949 MPa and 7210 MPa, respectively. As is evident from Table 3, Module Sample #3, a module 100a with an interlayer elastic modulus of 7 GPa (e.g., based on an application-driven material choice for the interlayer 75 that results in an elastic modulus of 7 GPa) can be designed in terms of adhesive layer thickness and interlayer thickness to achieve the same 10% reduction in the tensile stress at the first primary surface 54, as similarly observed in the Module Sample #2. As is also evident from Table 3, Module Sample #4, a module 100a with an interlayer thickness of 100 μm and elastic modulus of 5 GPa (e.g., based on another application-driven material choice for the interlayer 75) can be designed in terms of adhesive layer thickness and elastic modulus to achieve the same 10% reduction in the tensile stress at the first primary surface 54, as similarly observed in the Module Sample #2.

TABLE 3

| Module Sample# | Adhesive Layer Thickness (μm) | Interlayer Thickness (μm) | Adhesive Layer Modulus (GPa) | Interlayer Modulus (GPa) | Tensile Stress at Primary Surface 54 (MPa) | Tensile Stress at Primary Surface 56 (MPa) | Stress Reduction at Surface 54 (%) | Stress Reduction at Surface 56 (%) |
|---|---|---|---|---|---|---|---|---|
| 1 | 10.828 | 108.75 | 0.001 | 1.845 | 3949 | 7210 | 0 | 0 |
| 2 | 25 | 73.97 | 0.001 | 10 | 3554 | 6293 | 10 | 13 |
| 3 | 20.84 | 122.92 | 0.001 | 7 | 3554 | 5876 | 10 | 19 |
| 4 | 18.85 | 100.00 | 10 | 5 | 3554 | 5112 | 10 | 29 |

Referring now to Table 4 below, the modeling work in this example (i.e., as detailed earlier in the DOE-CCD model of Table 1) can be employed in a further approach to design the configuration of the foldable electronic device modules 100a of the disclosure to minimize the tensile stresses observed at the primary surface 54 from the Pen Drop Test and bending forces in the module from simulated bending associated with the Two-Point Bend Test. As shown earlier in Table 2, Module Sample#1, a 'baseline' module 100a with a first adhesive layer thickness of 10.83 μm, interlayer thickness of 108.75 μm and interlayer modulus of 1.845 GPa exhibits tensile stresses a the first primary surfaces 54 of 3949 MPa. As is evident from Table 4, Module Samples#1-#4, each represent a module 100a with an interlayer elastic modulus of 5 GPa and first adhesive modulus of 0.001 GPa (e.g., based on an application-driven material choices for the interlayer 75 and first adhesive 10a) can be designed in terms of adhesive layer and interlayer thicknesses to achieve reductions in the tensile stresses observed at the first primary surface 54 relative to Module Sample#1 in Table 2 and bend forces of 50 N or less.

TABLE 4

| Module Sample# | Adhesive Layer Thickness (μm) | Interlayer Thickness (μm) | Adhesive Layer Modulus (GPa) | Interlayer Modulus (GPa) | Tensile Stress at Primary Surface 54 (MPa) | Tensile Stress at Primary Surface 56 (MPa) | Bending Force (N) | Stress Reduction at Surface 56 (%) |
|---|---|---|---|---|---|---|---|---|
| 1 | 12.36 | 171.46 | 0.001 | 5 | 3625 | 6079 | 50 | 8 |
| 2 | 14.83 | 133.34 | 0.001 | 5 | 3691 | 6154 | 25 | 7 |

TABLE 4-continued

| Module Sample# | Adhesive Layer Thickness (μm) | Interlayer Thickness (μm) | Adhesive Layer Modulus (GPa) | Interlayer Modulus (GPa) | Tensile Stress at Primary Surface 54 (MPa) | Tensile Stress at Primary Surface 56 (MPa) | Bending Force (N) | Stress Reduction at Surface 56 (%) |
|---|---|---|---|---|---|---|---|---|
| 3 | 22.96 | 114.90 | 0.001 | 5 | 3762 | 6300 | 15 | 5 |
| 4 | 25.00 | 90.48 | 0.001 | 5 | 3846 | 6403 | 10 | 3 |

Figure 7A:
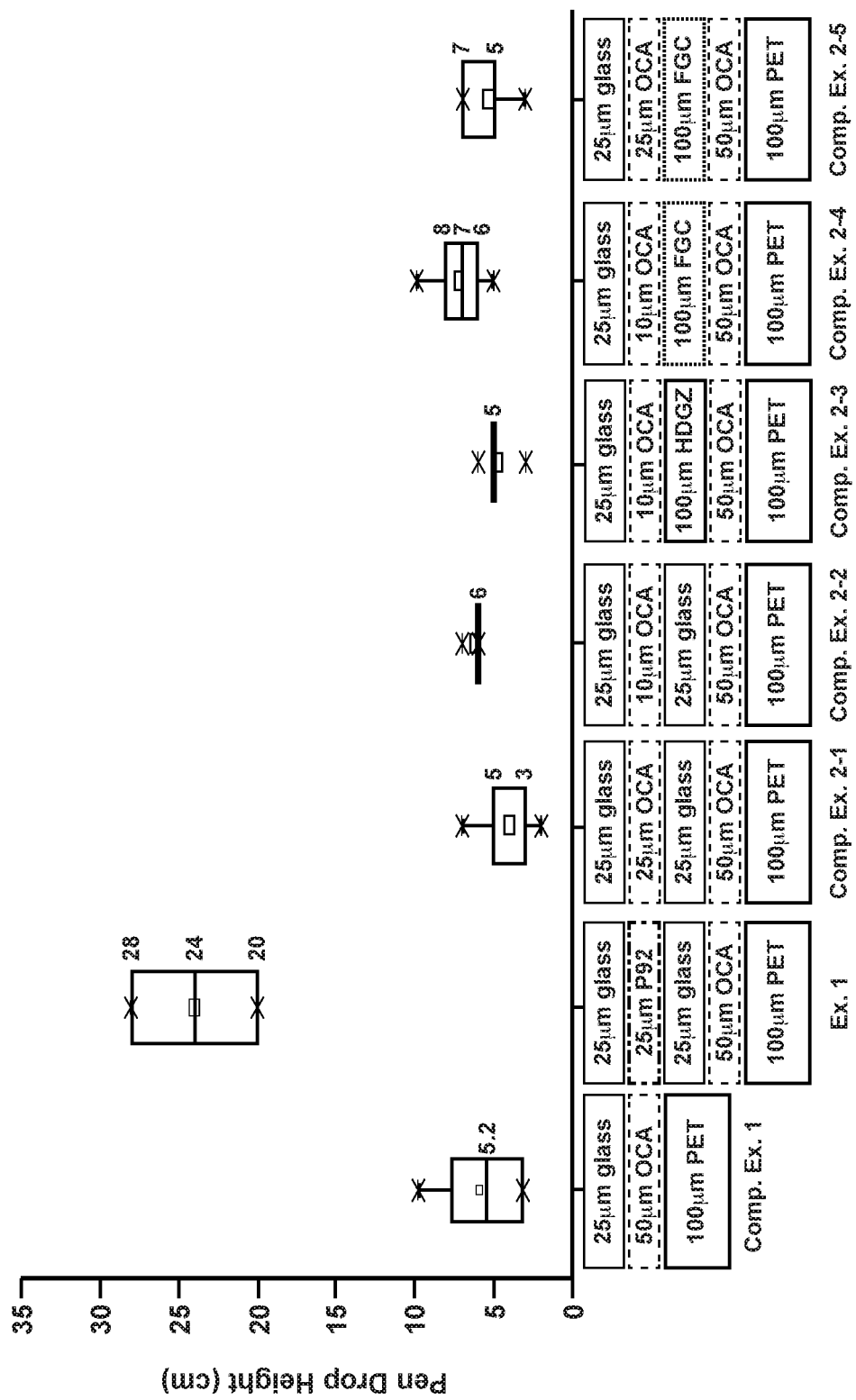
FIGS. 7A-7C are plots of average pen drop heights for foldable electronic device modules and a comparative device module, as tested in a Pen Drop Test, according to aspects of the disclosure.
Figure 7B:
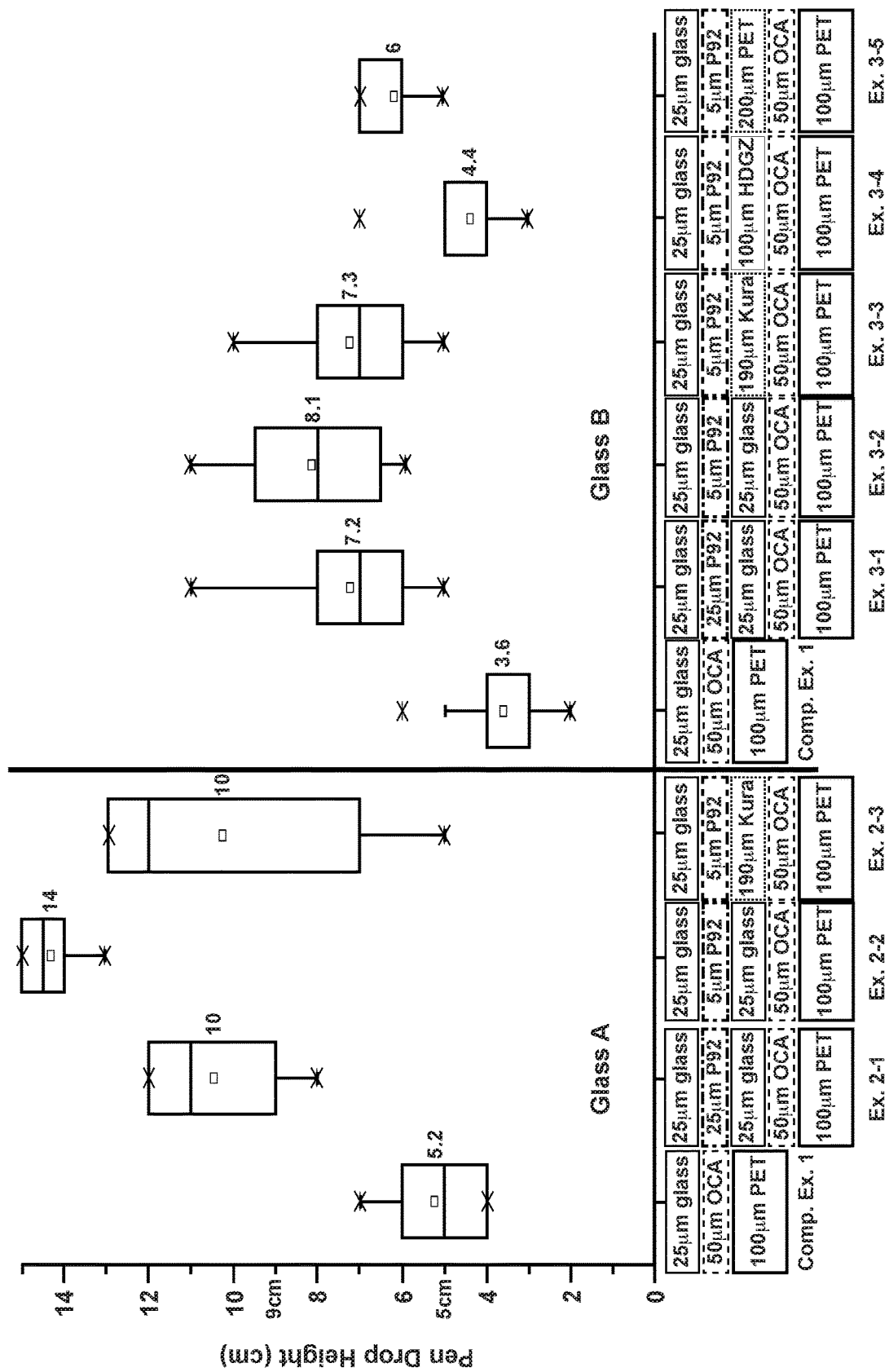
Figure 7C:
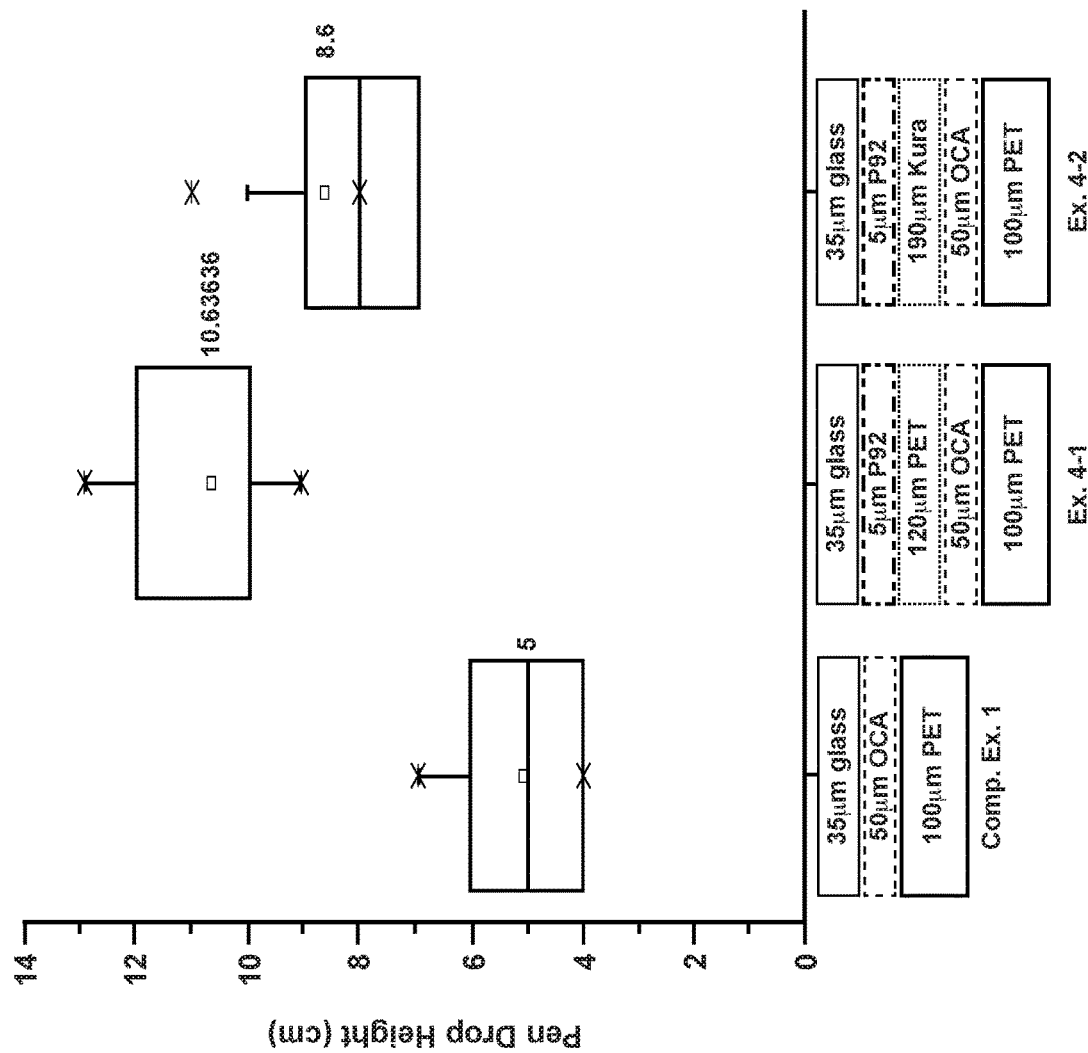

Referring now to FIGS. 7A-7C, plots are provided of average pen drop heights for foldable electronic device modules and a comparative device module, as tested in actual Pen Drop Tests (i.e., with varying pen drop heights). In FIG. 7A, an average pen drop height of 5.2 cm is shown for a comparative sample (Comp. Ex. 1) having a 3-layer configuration of a substrate comprising OCA (50 μm) and PET (100 μm), and a glass-containing cover element (25 μm). It is evident from FIG. 7A that the average pen drop height observed in other 5-layer modules samples with OCA as a first adhesive and interlayers of Gunze HD film (HDGZ), fiber glass (FGC) and glass (Comp. Exs. 2-1, 2-3, 2-4 and 2-5) are similar to those reported in the 3-layer module (Comp. Ex. 1). Further, decrease in thickness of the first adhesive as OCA from 25 μm (Comp. Ex. 2-1) to 10 μm (Comp. Ex. 2-2) also produced no significant difference in average pen drop height. Nevertheless, a significantly higher average pen drop height of about 24 cm was observed in a 5-layer module employing Lens Bond P-92 as the first adhesive and glass as the interlayer. Without being bound by theory, it is believed that the increased elastic modulus of the P-92 material (~1.72 GPa) relative to the elastic modulus of the OCA material (~70 MPa) contributed to the improved impact resistance of this module.

In FIG. 7B, average pen drop heights of 5.2 cm and 3.6 cm are shown for comparative samples (Comp. Ex. 1) having a 3-layer configuration of a substrate comprising OCA (50 μm) and PET (100 μm) and a glass-containing cover element (25 μm). The first group under the Glass A heading employed the Glass 1 composition noted earlier. The second group under the Glass B heading also employed the Glass 1 composition noted earlier, but fabricated with different draw conditions. Further, FIG. 7B also shows average pen drop heights for various 5-layer modules (Exs. 2-1 to 2-3 and 3-1 to 3-5) employing a first adhesive comprising Lens Bond P-92 material with two thicknesses (5 μm and 25 μm) and various interlayer materials (e.g., glass, Kuraray Spallshield™ CPET film, PET film and HDGZ film). It is evident from FIG. 7B that all of the 5-layer modules employing P-92 material as the first adhesive exhibited pen drop heights in excess of 6 cm, except for the Ex. 3-4 with the HDGZ brittle interlayer material. It is also evident from FIG. 7B that decreasing the thickness of the P-92 first adhesive material tends to increase average pen drop height in module configurations with a glass-containing interlayer.

In FIG. 7C, an average pen drop height of 5.2 cm is shown again for a comparative sample (Comp. Ex. 1) having a 3-layer configuration of a substrate comprising OCA (50 μm) and PET (100 μm), and a glass-containing cover element (35 μm). It is evident from FIG. 7C that the average pen drop height observed in other 5-layer modules samples (Ex. 4-1 and 4-2) with P-92 as a first adhesive, the same cover element thickness (35 μm) and interlayers of PET or Kuraray Spallshield™ (i.e., a PEC film) was significantly higher at 10.64 cm and 8.6, respectively.

It will be apparent to those skilled in the art that various modifications and variations can be made to the foldable electronic device modules of the disclosure without departing from the spirit or scope of the claims.

What is claimed is:

1. A foldable electronic device module, comprising:
a cover element having a thickness from 25 μm to 200 μm and a cover element elastic modulus from 20 GPa to 140 GPa, the cover element further comprising a component having a glass composition, a first primary surface, and a second primary surface;
a stack comprising:
(a) an interlayer having first and second primary surfaces, an interlayer elastic modulus from 0.01 GPa to 10 GPa and a thickness from 50 μm to 200 μm, and
(b) a flexible electronic device substrate having a thickness from 25 μm to 200 μm that is coupled to the interlayer; and
a first adhesive joining the stack to the second primary surface of the cover element, the first adhesive characterized by an elastic modulus from 0.001 GPa to 10 GPa and a thickness from 5 μm to about 25 μm,
wherein the foldable electronic device module comprises an impact resistance characterized by a tensile stress of less than 4100 MPa at the first primary surface of the cover element and a tensile stress of less than 8300 MPa at the second primary surface of the cover element upon impact of a ball point pen dropped from a pen drop height of 10 cm with the cover element in a Pen Drop Test.

2. The foldable electronic device module according to claim 1, wherein the impact resistance is characterized by the tensile stress of less than 3900 MPa at the first primary surface of the cover element and the tensile stress of less than 7000 MPa at the second primary surface of the cover element upon impact of the ball point pen dropped from the pen drop height of 10 cm with the cover element in the Pen Drop Test.

3. The foldable electronic device module according to claim 2, wherein the impact resistance is characterized by the tensile stress of less than 3700 MPa at the first primary surface of the cover element and the tensile stress of less than 5500 MPa at the second primary surface of the cover element upon impact of the ball point pen dropped from the pen drop height of 10 cm with the cover element in the Pen Drop Test.

4. The foldable electronic device module according to claim 1, wherein the interlayer elastic modulus is from 5 GPa to 10 GPa.

5. The foldable electronic device module according to claim 1, wherein the thickness of the interlayer is from 125 μm to 200 μm.

6. The foldable electronic device module according to claim 5, wherein the impact resistance is characterized by the tensile stress of less than 3650 MPa at the first primary surface of the cover element and the tensile stress of less than 6000 MPa at the second primary surface of the cover element upon impact of the ball point pen dropped from the pen drop height of 10 cm with the cover element in the Pen Drop Test.

7. The foldable electronic device module according to claim 1, wherein the flexible electronic device substrate is a flexible organic light emitting diode (OLED) substrate,
wherein the first adhesive comprises one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin, and
further wherein the interlayer comprises one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

8. A foldable electronic device module, comprising:
a cover element having a thickness from 25 µm to 200 µm and a cover element elastic modulus from 20 GPa to 140 GPa, the cover element further comprising a component having a glass composition, a first primary surface, and a second primary surface;
a stack comprising:
(a) an interlayer having first and second primary surfaces, an interlayer elastic modulus from 0.01 GPa to 10 GPa and a thickness from 50 µm to 200 µm, and
(b) a flexible electronic device substrate having a thickness from 25 µm to 200 µm that is coupled to the interlayer; and
a first adhesive joining the stack to the second primary surface of the cover element, the first adhesive characterized by an elastic modulus from 0.001 GPa to 10 GPa and a thickness from 5 µm to 25 µm,
wherein the foldable electronic device module comprises a bending resistance characterized by a bend force of less than 110 N in the foldable electronic device module upon bending the foldable electronic device module in a Two-Point Bend Test such that the first primary surface of the cover element is concave.

9. The foldable electronic device module according to claim 8, wherein the bend force is less than 70 N in the foldable electronic device module upon bending the foldable electronic device module in the Two-Point Bend Test such that the first primary surface of the cover element is concave.

10. The foldable electronic device module according to claim 8, wherein the thickness of the interlayer is from 50 µm to 125 µm.

11. The foldable electronic device module according to claim 10, wherein the bend force is less than 60 N in the foldable electronic device module upon bending the foldable electronic device module in the Two-Point Bend Test such that the first primary surface of the cover element is concave.

12. The foldable electronic device module according to claim 8, wherein the interlayer elastic modulus is from 0.01 GPa to 5 GPa.

13. The foldable electronic device module according to claim 12, wherein the bend force is less than 70 N in the foldable electronic device module upon bending the foldable electronic device module in the Two-Point Bend Test such that the first primary surface of the cover element is concave.

14. The foldable electronic device module according to claim 8, wherein the flexible electronic device substrate is a flexible organic light emitting diode (OLED) substrate,
wherein the first adhesive comprises one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin, and
further wherein the interlayer comprises one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

15. A foldable electronic device module, comprising:
a cover element having a thickness from 25 µm to 200 µm and a cover element elastic modulus from 20 GPa to 140 GPa, the cover element further comprising a component having a glass composition, a first primary surface, and a second primary surface;
a stack comprising:
(a) an interlayer having first and second primary surfaces, an interlayer elastic modulus from 0.01 GPa to 10 GPa and a thickness from 50 µm to 200 µm, and
(b) a flexible electronic device substrate having a thickness from 25 µm to 200 µm that is coupled to the interlayer; and
a first adhesive joining the stack to the second primary surface of the cover element, the first adhesive characterized by an elastic modulus from 0.001 GPa to 10 GPa and a thickness from 5 µm to 25 µm,
wherein the foldable electronic device module comprises a bend stress resistance characterized by a tensile stress of less than 200 MPa at the second primary surface of the cover element upon bending the foldable electronic device module in a Two-Point Bend Test with a plate spacing of 6 mm such that the first primary surface of the cover element is concave.

16. The foldable electronic device module according to claim 15, wherein the bend stress resistance is characterized by the tensile stress of less than 150 MPa at the second primary surface of the cover element upon bending the foldable electronic device module in the Two-Point Bend Test with the plate spacing of 6 mm such that the first primary surface of the cover element is concave.

17. The foldable electronic device module according to claim 15, wherein the interlayer elastic modulus is from 0.01 GPa to 5 GPa.

18. The foldable electronic device module according to claim 17, wherein the bend stress resistance is characterized by the tensile stress of less than 140 MPa at the second primary surface of the cover element upon bending the foldable electronic device module in the Two-Point Bend Test with the plate spacing of 6 mm such that the first primary surface of the cover element is concave.

19. The foldable electronic device module according to claim 15, wherein the thickness of the interlayer is from 50 µm to 125 µm.

20. The foldable electronic device module according to claim 19, wherein the bend stress resistance is characterized by the tensile stress of less than 80 MPa at the second primary surface of the cover element upon bending the foldable electronic device module in the Two-Point Bend Test with the plate spacing of 6 mm such that the first primary surface of the cover element is concave.

21. The foldable electronic device module according to claim 15, wherein the flexible electronic device substrate is a flexible organic light emitting diode (OLED) substrate,
   wherein the first adhesive comprises one or more of an epoxy, a urethane, an acrylate, an acrylic, a styrene copolymer, a polyisobutylene, a polyvinyl butyral, an ethylene vinyl acetate, sodium silicate, an optically clear adhesive (OCA), a pressure sensitive adhesive (PSA), polymeric foam, a natural resin, and a synthetic resin, and
   further wherein the interlayer comprises one or more of a poly(methyl methacrylate), a polycarbonate, a polyethylene terephthalate, a polyimide, a cellulose acetate butyrate, a polystyrene, a styrene acrylonitrile, a styrene methyl methacrylate, a glass fiber reinforced polymer (GFRP), silica particles, zirconia particles, titania particles, and silica sol-gels.

22. A foldable electronic device module, comprising:
   a cover element having a thickness from 25 µm to 200 µm and a cover element elastic modulus from 20 GPa to 140 GPa, the cover element further comprising a component having a glass composition, a first primary surface, and a second primary surface;
   a stack comprising:
      (a) an interlayer having first and second primary surfaces, an interlayer elastic modulus from 0.01 GPa to 140 GPa and a thickness from 50 µm to 200 µm, and
      (b) a flexible electronic device substrate having a thickness from 25 µm to 200 µm that is coupled to the interlayer; and
   a first adhesive joining the stack to the second primary surface of the cover element, the first adhesive characterized by an elastic modulus from 1 GPa to 10 GPa and a thickness from 5 µm to 25 µm,
   wherein the foldable electronic device module comprises an impact resistance characterized by an average pen drop height of 6 cm or greater for a set of impacts to the cover element in a Pen Drop Test.

23. The foldable electronic device module according to claim 22, wherein the average pen drop height is 7.2 cm or greater for the set of impacts to the cover element in the Pen Drop Test.

24. The foldable electronic device module according to claim 22, wherein the thickness of the interlayer is of about 5 µm and comprises a UV-cured photopolymer.

\* \* \* \* \*